(12) United States Patent
Takano

(10) Patent No.: US 6,948,623 B2
(45) Date of Patent: Sep. 27, 2005

(54) FRAME FOR HOUSING PLATE MATERIALS

(75) Inventor: Hitoshi Takano, Sagamihara (JP)

(73) Assignee: Nix, Inc., Yokohama (JP)

(*) Notice: Subject to any disclaimer, the term of this patent is extended or adjusted under 35 U.S.C. 154(b) by 230 days.

(21) Appl. No.: 10/337,826

(22) Filed: Jan. 8, 2003

(65) Prior Publication Data

US 2003/0132176 A1 Jul. 17, 2003

(30) Foreign Application Priority Data

Jan. 11, 2002  (JP) ........................................ 2002-004437

(51) Int. Cl.$^7$ ............................................. A47G 19/08
(52) U.S. Cl. ................................................... 211/41.1
(58) Field of Search ............................. 211/41.1, 41.12, 211/41.13, 41.15, 41.16, 41.17, 41.18

(56) References Cited

U.S. PATENT DOCUMENTS

| | | | | |
|---|---|---|---|---|
| 5,490,011 A | * | 2/1996 | Pernick et al. ............... | 359/601 |
| 5,775,000 A | * | 7/1998 | Maekawa et al. .............. | 34/58 |
| 6,086,127 A | * | 7/2000 | Korn et al. ................... | 294/159 |
| 6,098,808 A | * | 8/2000 | Matsuda et al. ............. | 206/708 |
| 6,227,590 B1 | * | 5/2001 | Korn et al. .................. | 294/159 |
| 6,290,076 B1 | * | 9/2001 | Sayers ........................ | 211/41.1 |
| 6,328,169 B1 | | 12/2001 | Matsuda et al. | |
| 6,550,623 B2 | * | 4/2003 | Cook et al. ................. | 211/13.1 |

FOREIGN PATENT DOCUMENTS

JP         2002-84081        3/2002

* cited by examiner

Primary Examiner—Peter M. Cuomo
Assistant Examiner—Sarah Purol
(74) Attorney, Agent, or Firm—Oblon, Spivak, McClelland, Maier & Neustadt, P.C.

(57) ABSTRACT

A frame for housing plate materials includes a pair of laterally opposed side boards having formed equally thereon a plurality of parallel, mutually opposed support grooves; bases (top and bottom plates) formed on and beneath the side boards; joints for interconnecting the side boards and the bases; a device provided in the frame to adjust an interval between the side boards in order that given plate materials may be accommodated in the frame as spaced at predetermined intervals by causing paired edges of the plate materials to be inserted into the opposed support grooves; adjusting projections protruding slightly from the support grooves and disposed on at least either of mutually opposed inner surfaces of members suitably selected from among the side boards, bases and joints; and auxiliary adjusters disposed near the adjusting projections and adapted to allow terminal parts on at least one side of the plate materials to collide against the mutually opposed inner surfaces by simply moving one of the side boards toward the other side board while keeping the plate materials at predetermined or suitably selected positions between the opposed side boards, whereby the adjustment of clearance to be performed during the setting of the distance of the housing frame between the laterally opposite side boards may be carried out easily with one hand of the operator.

10 Claims, 26 Drawing Sheets

FIG_4
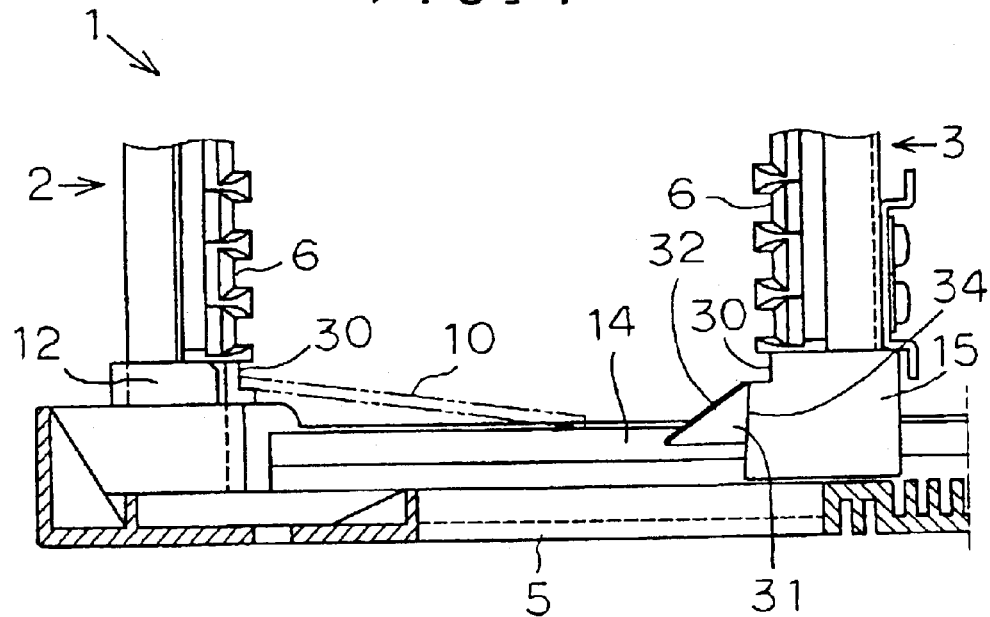
FIG_5
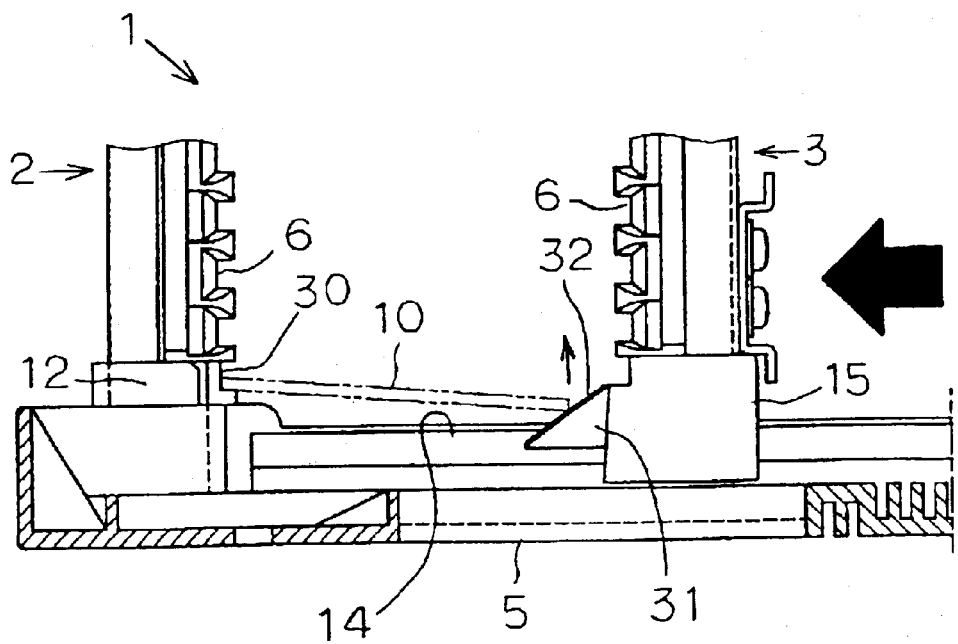

FIG_6
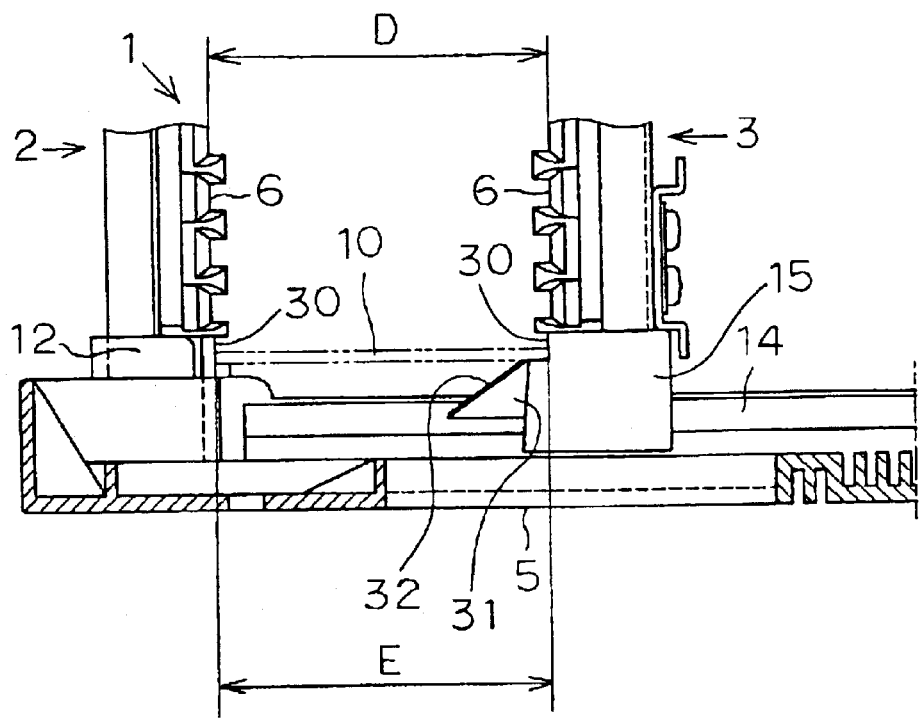
FIG_7
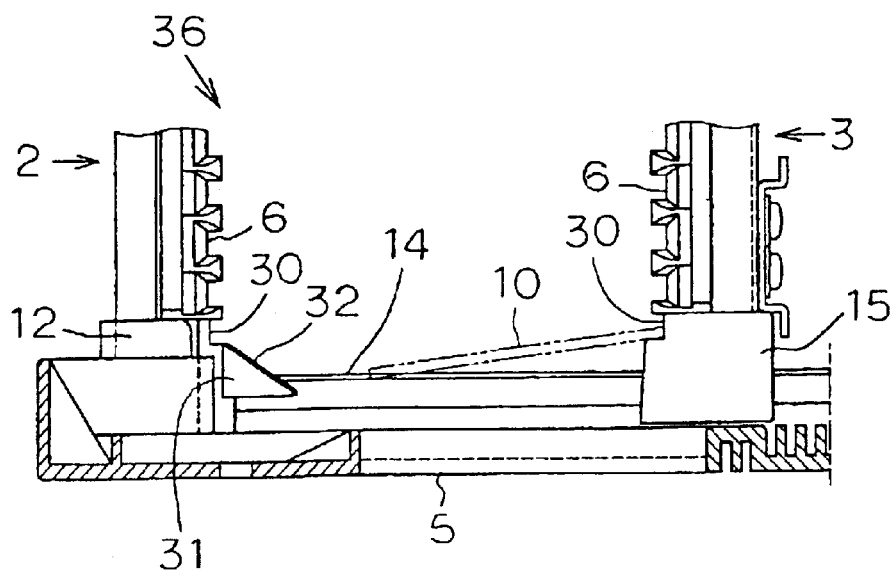

FIG_10
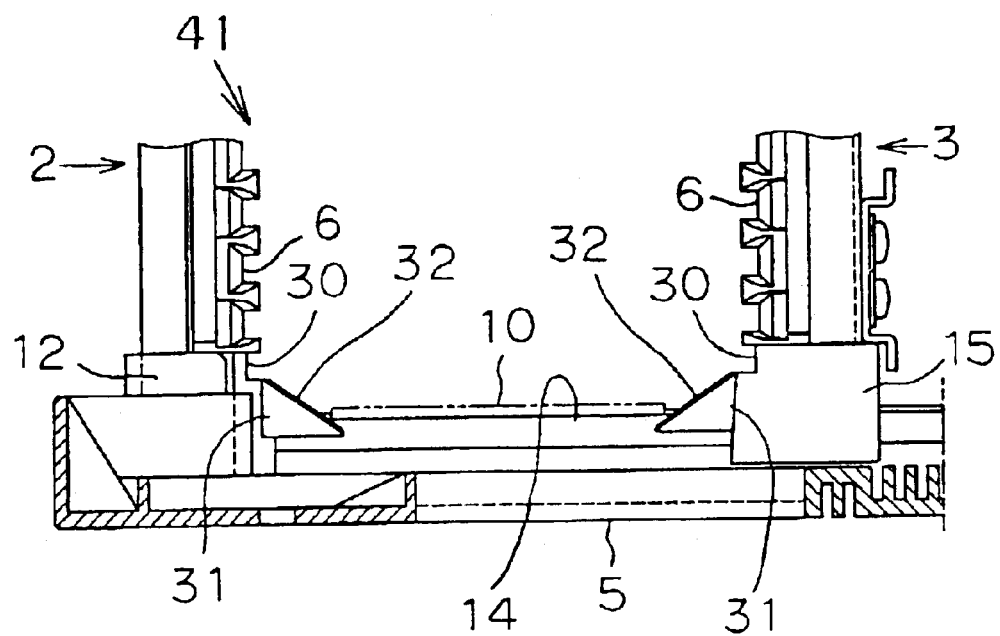
FIG_11
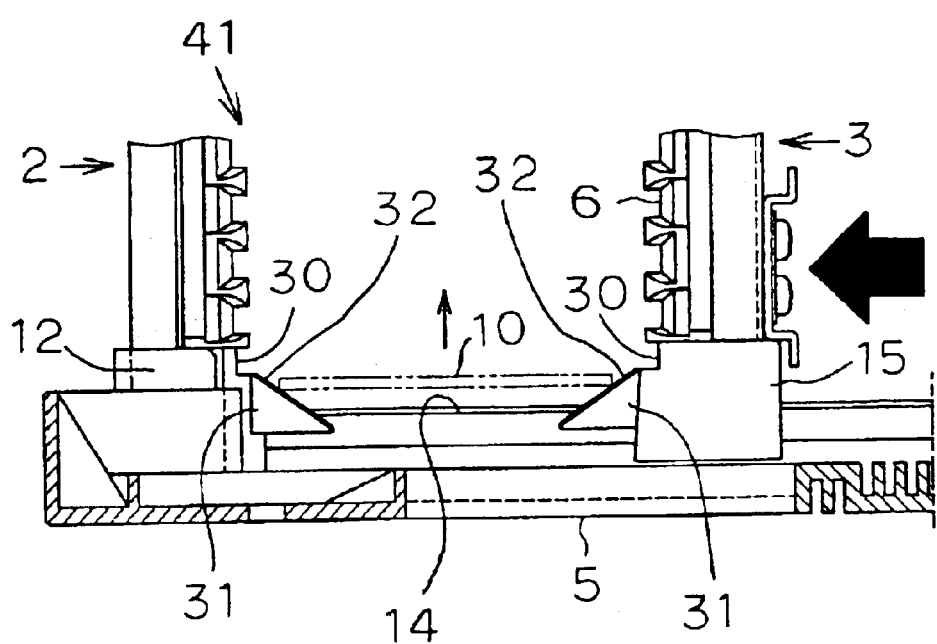

FIG_16
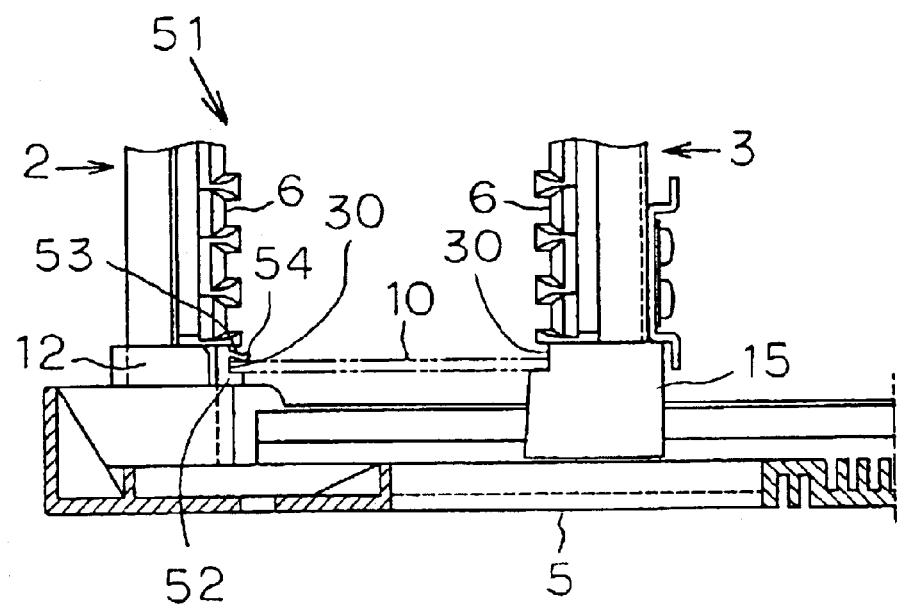
FIG_17
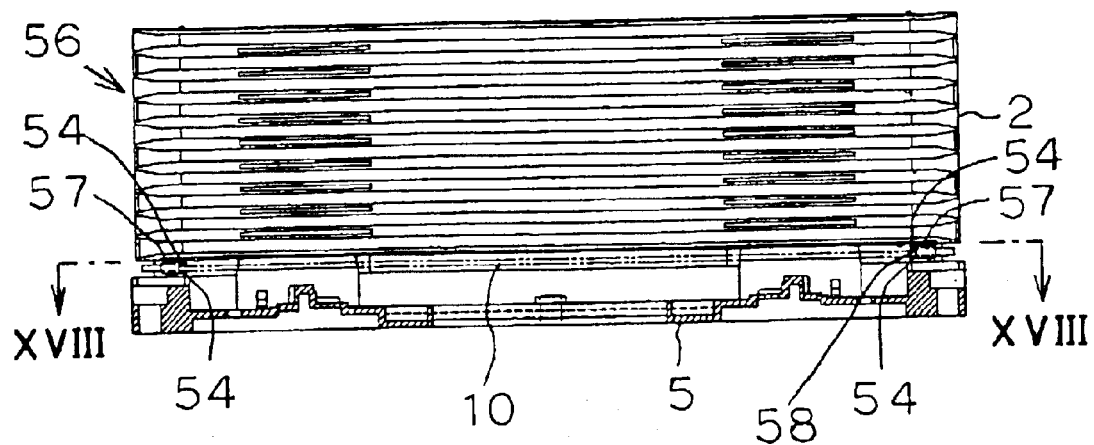

FIG_18
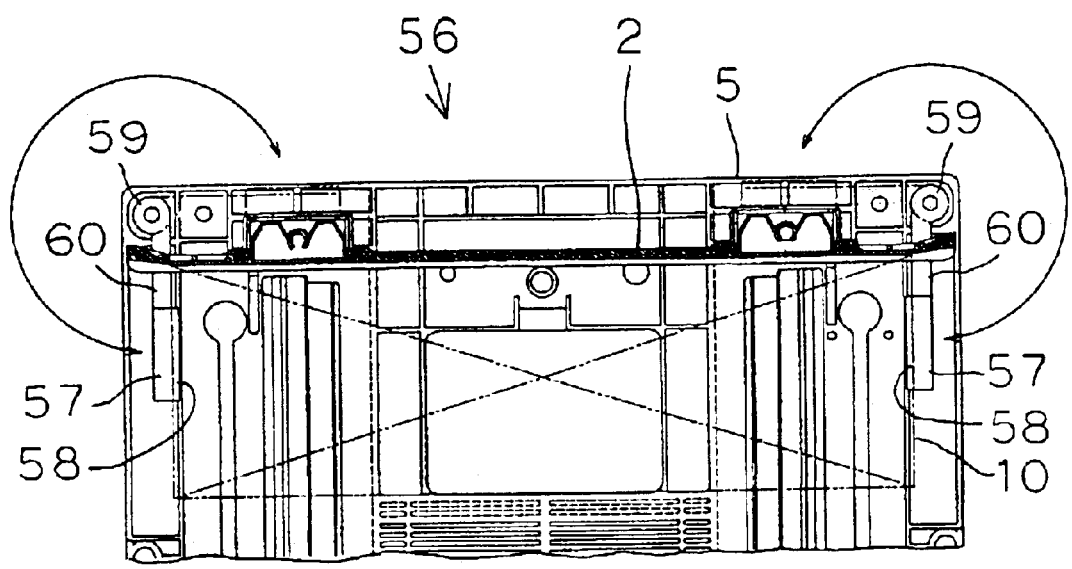
FIG_19
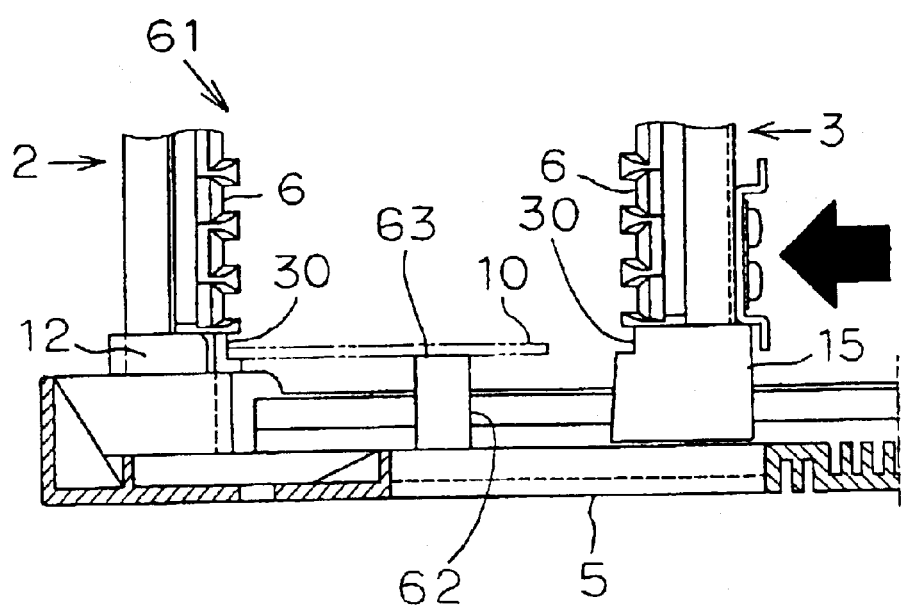

FIG_22
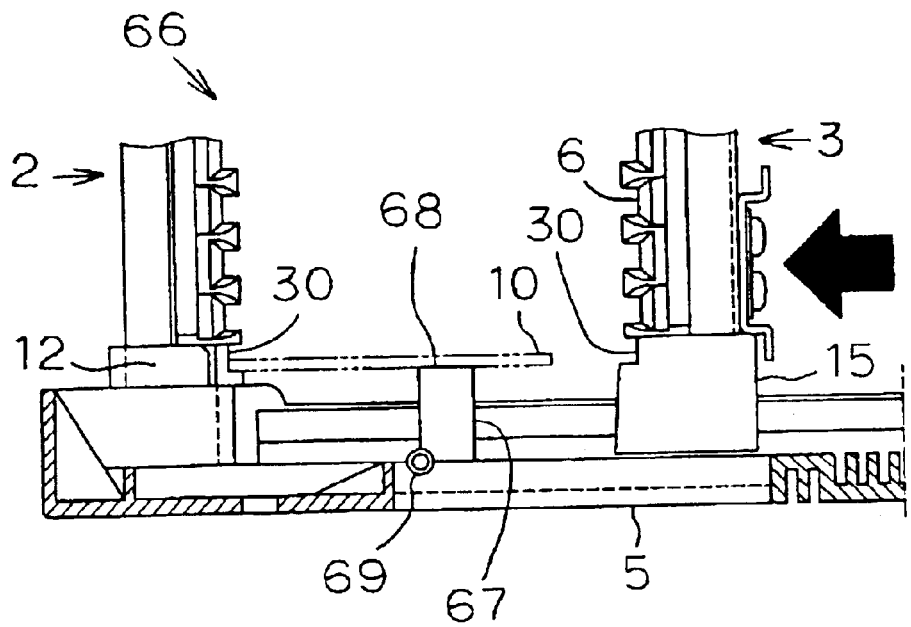
FIG_23
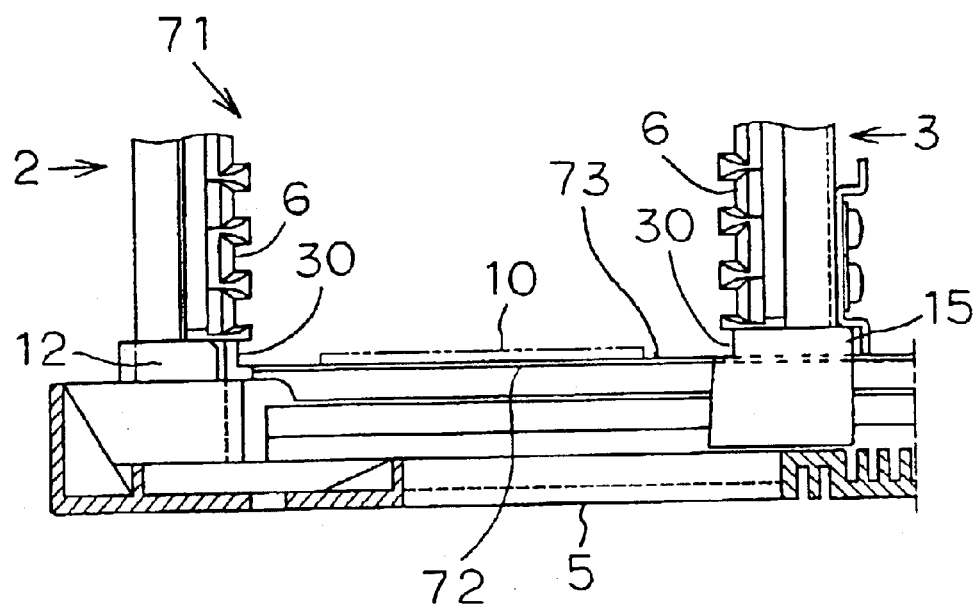

FIG_26
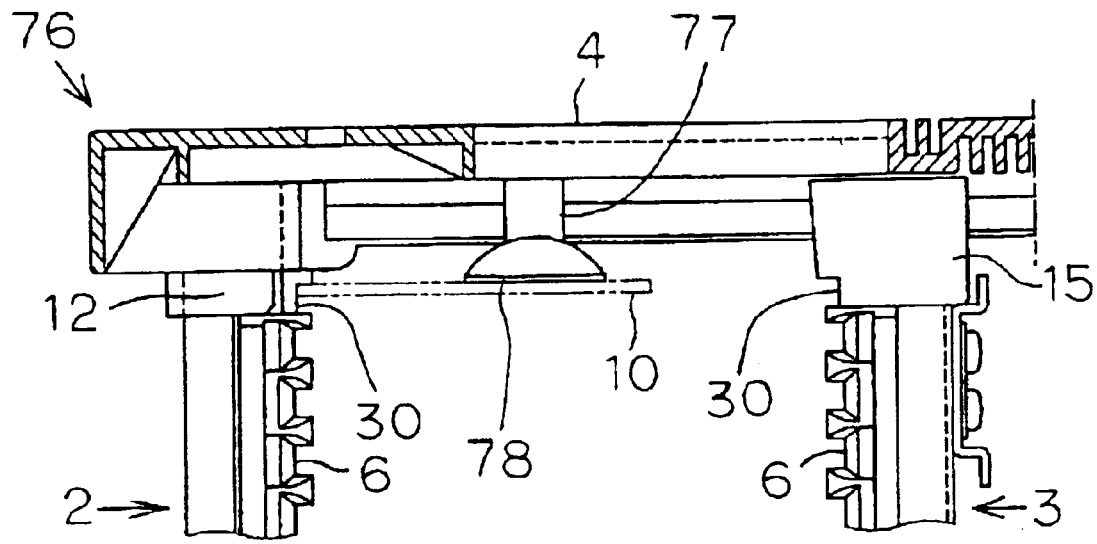
FIG_27
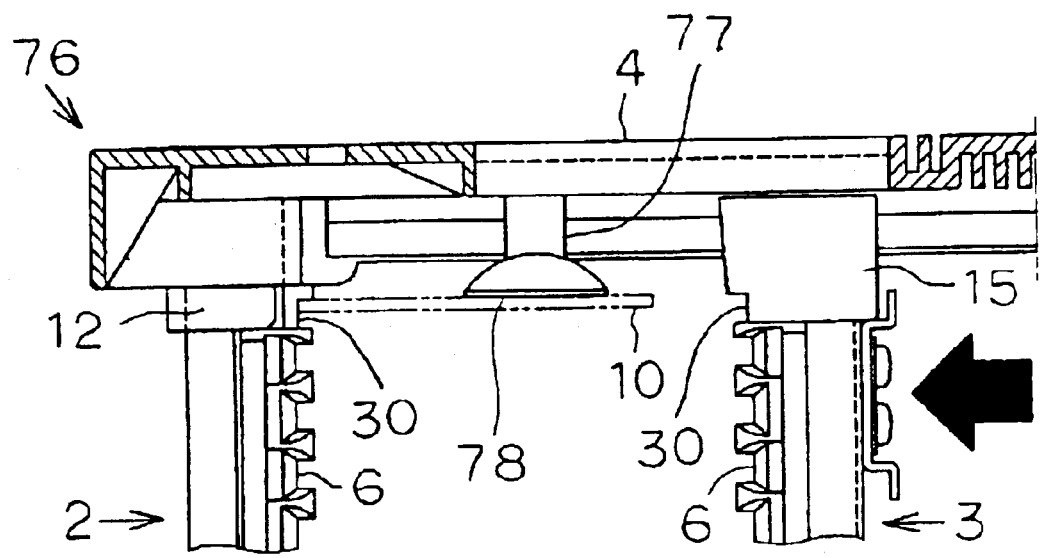

FIG_30
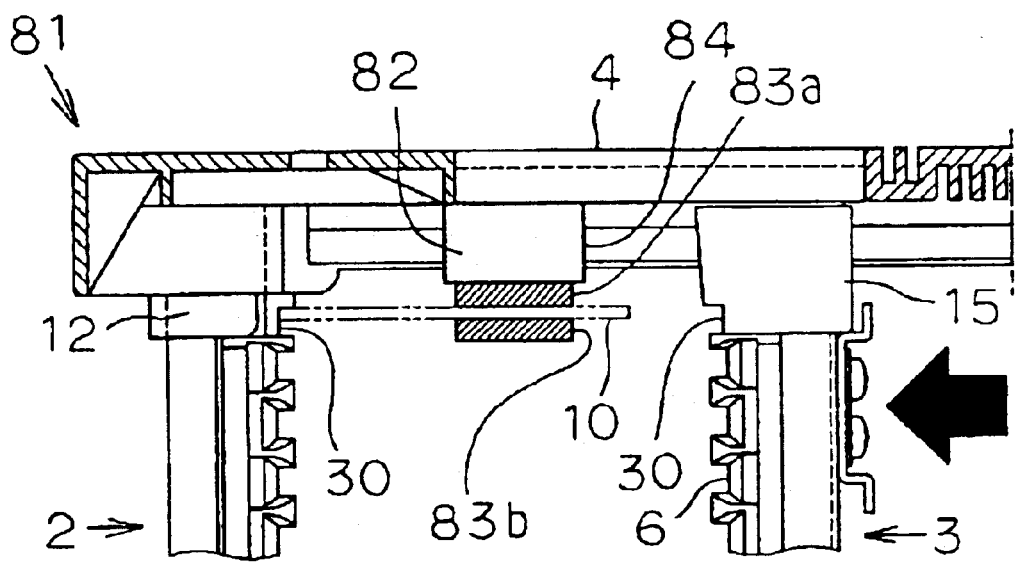
FIG_31
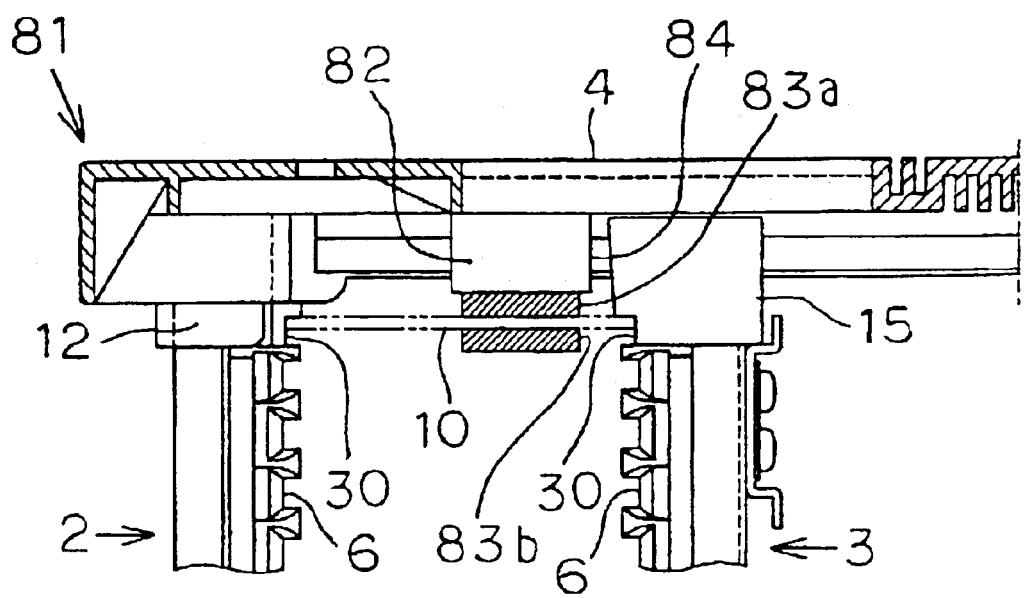

FIG_32
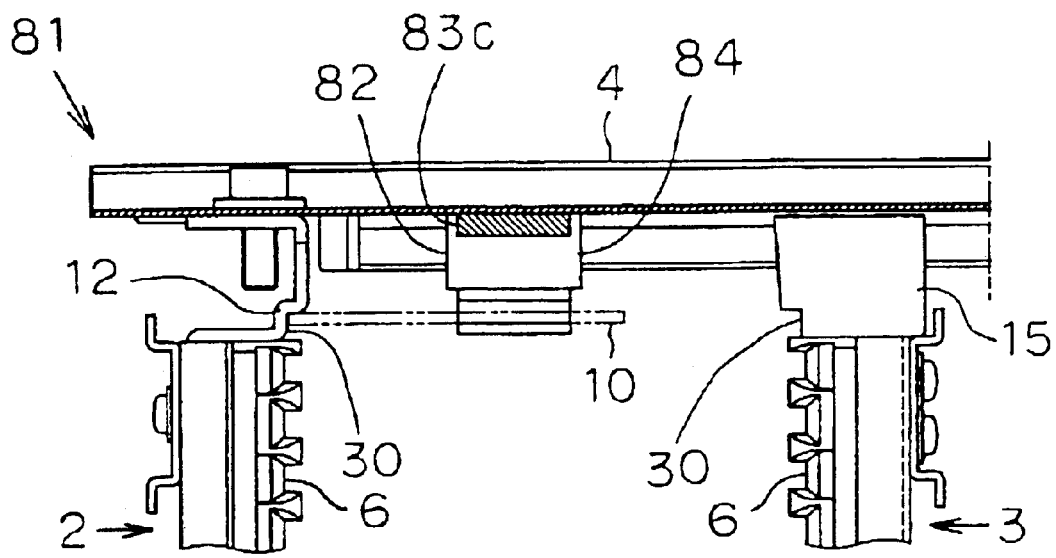
FIG_33
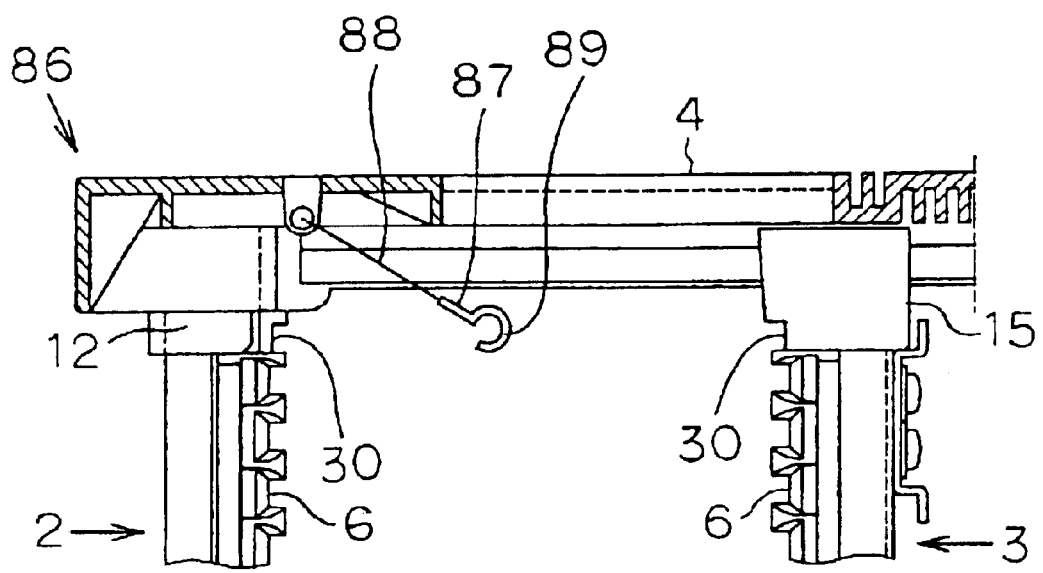

FIG_34
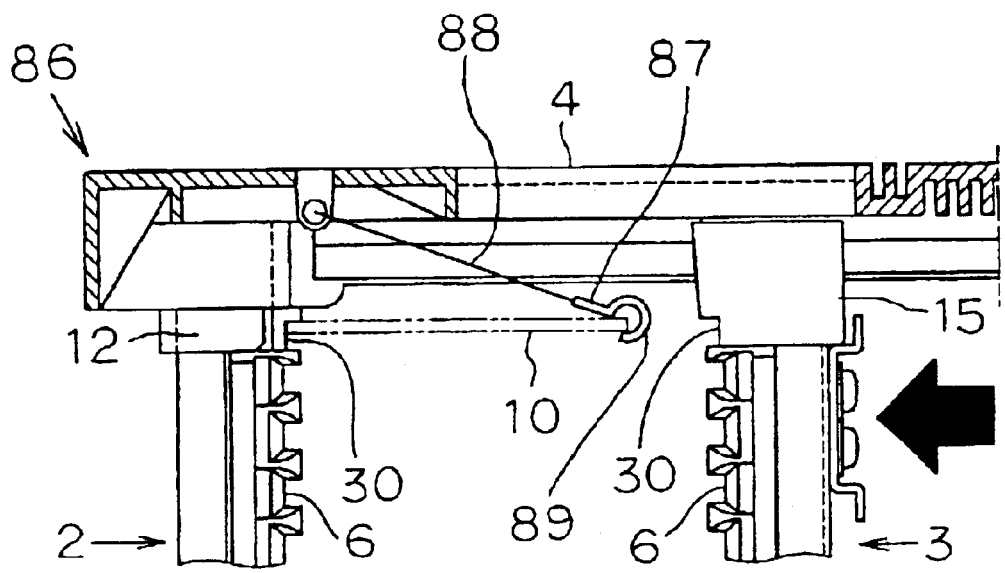
FIG_35
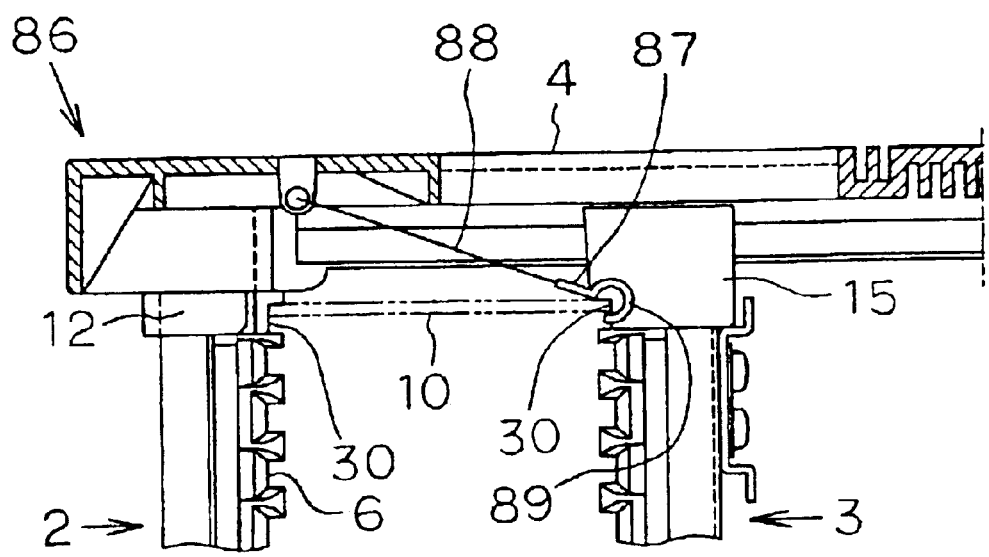

FIG_36
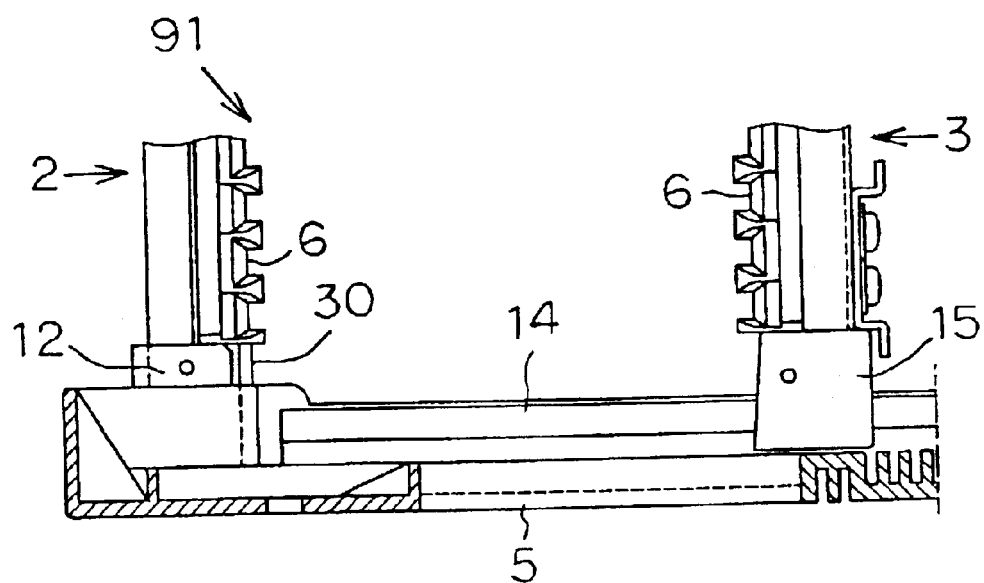
FIG_37
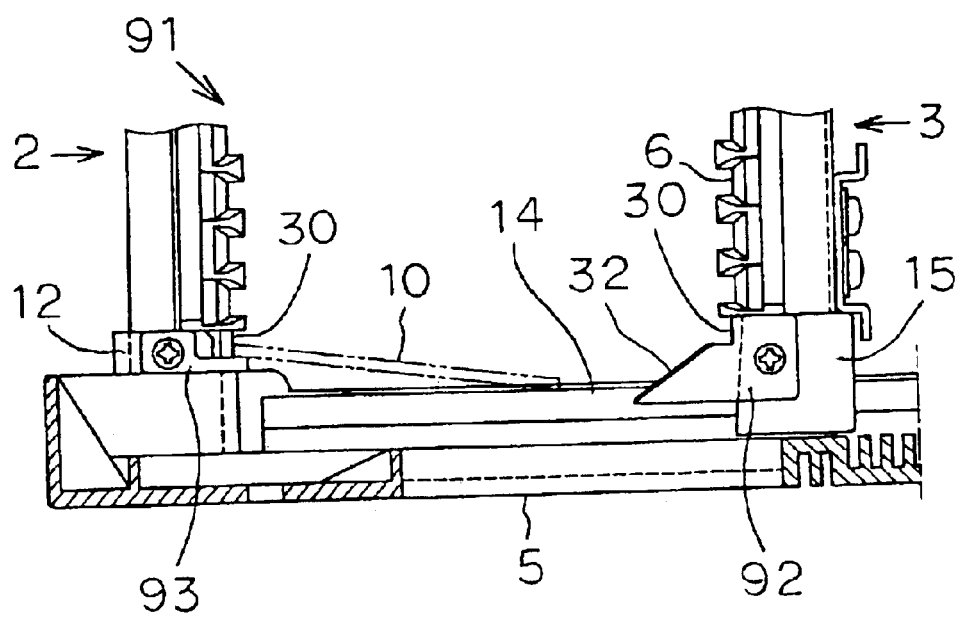

FIG_38
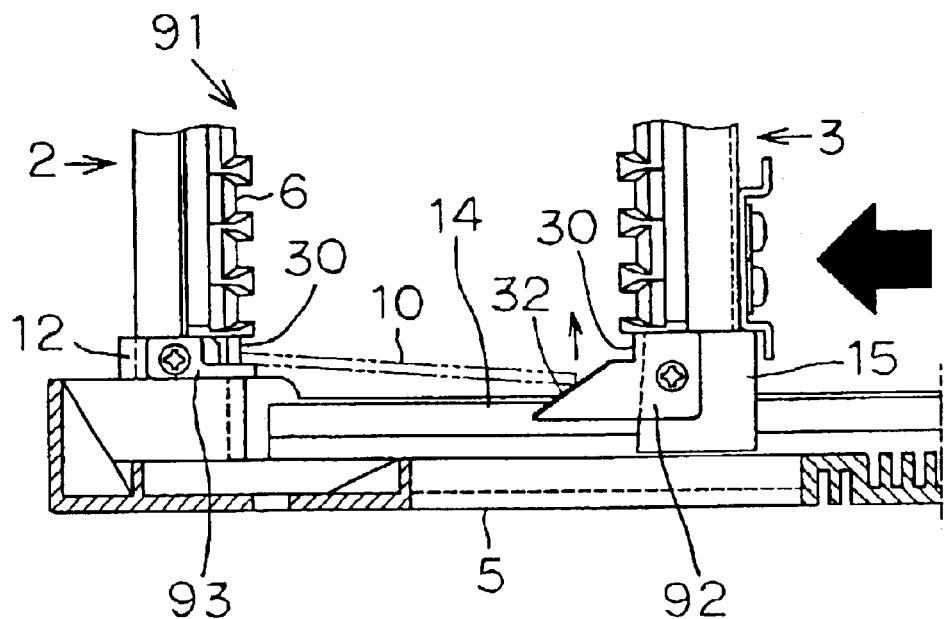
FIG_39
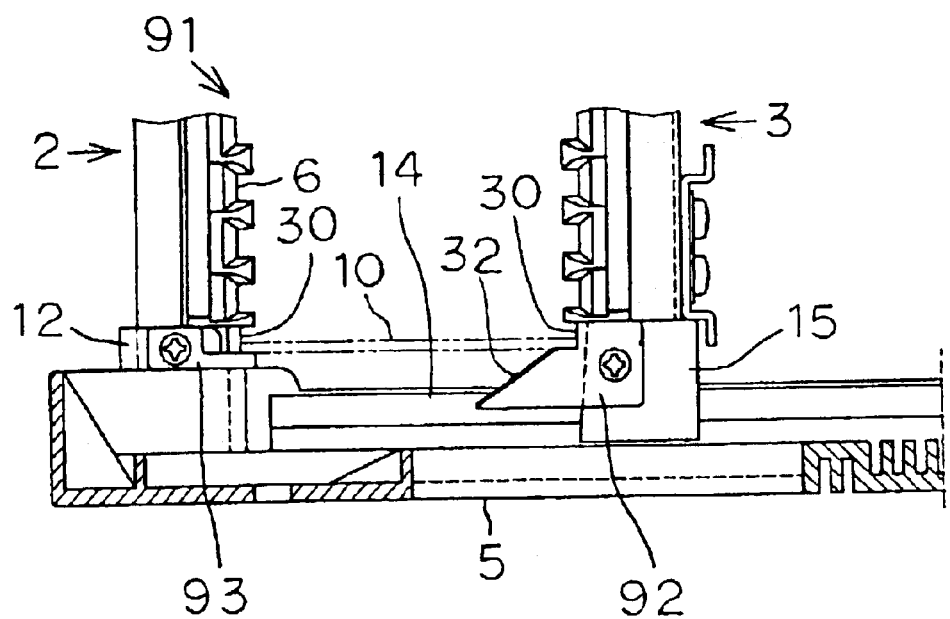

FIG_42
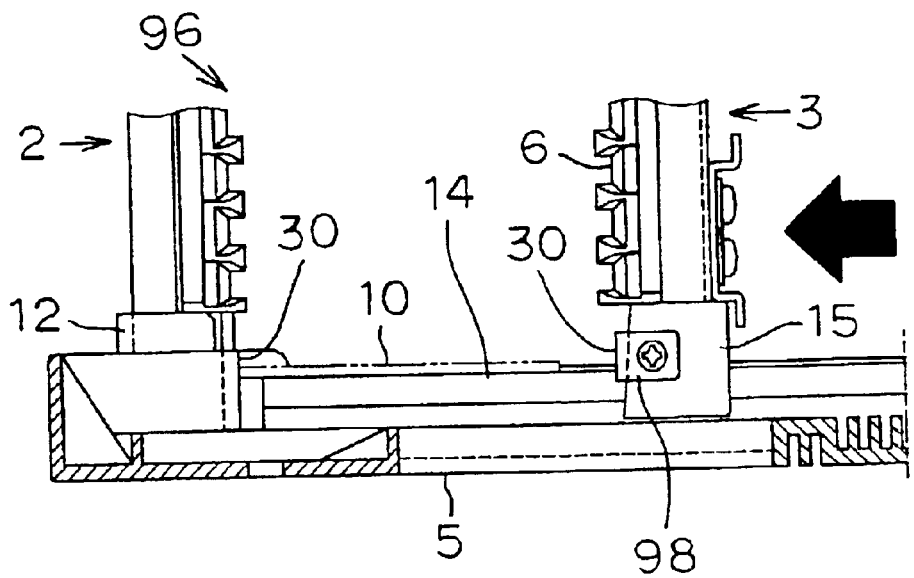
FIG_43
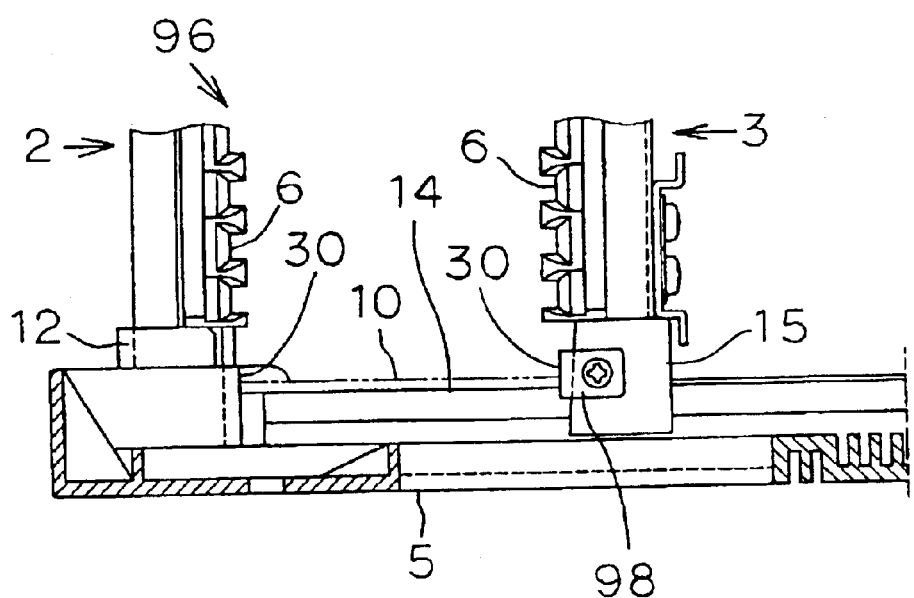

FIG_46
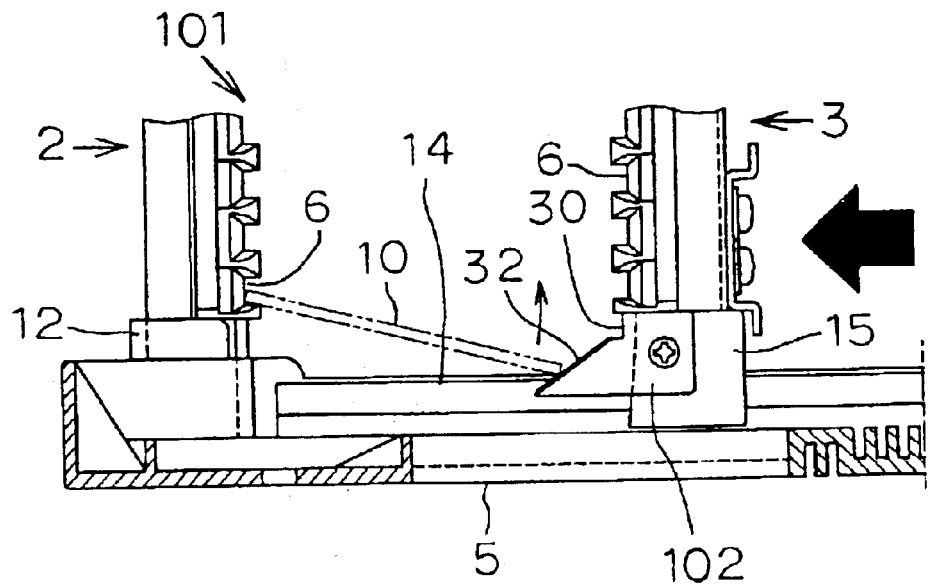
FIG_47
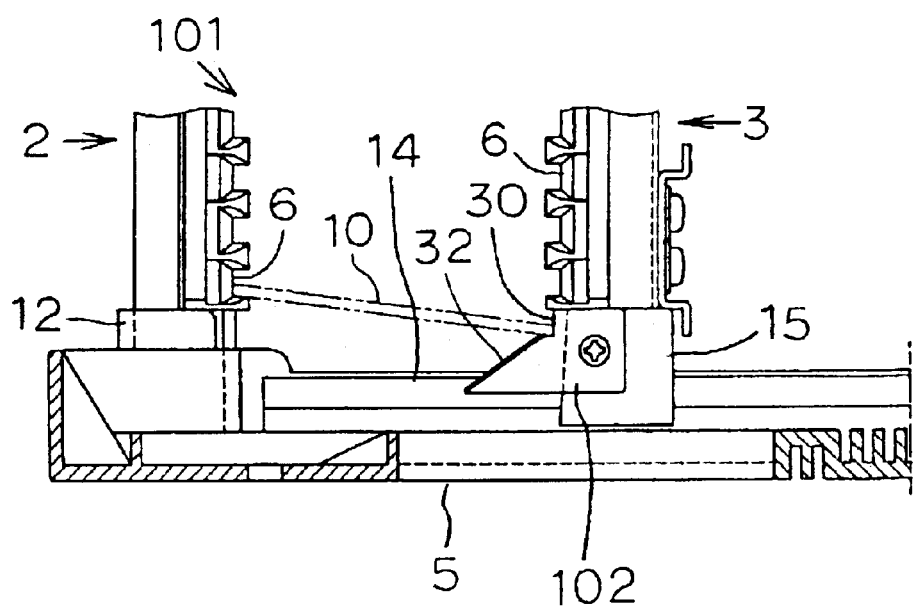

FRAME FOR HOUSING PLATE MATERIALS

BACKGROUND OF THE INVENTION

1. Field of the Invention

This invention relates to a frame for housing printed circuit boards incorporated in various electrical/electronic devices and plate materials used in other industrial fields, such as panels serving as building materials. More particularly, this invention relates to a plate material-housing frame that is adaptable to variation in the width of a plate material to be housed.

2. Description of the Prior Art

An example of the conventional housing frame will be described, with reference to FIG. 48. As illustrated in this diagram, for the purpose of fixing a top plate 111 and a bottom plate 112 as vertically opposed across a predetermined interval with four columns 113 and disposing laterally opposite side boards 114 and 115 in such a manner that the one side board 115 may be moved in the horizontal direction toward the other side board 114 and eventually fastened at a necessary position, the housing frame provides long holes 116 in the top and bottom plates 111 and 112, inserts through the long holes the axial parts of rotation-freezing members 117, such as hexagon-head bolts or continuous-thread studs which are capable of being fastened thereto from outside, fastens slide frames 118 at the positions corresponding to the long holes 116 outside the side board 115, and fastens to the upper and lower ends of the slide frames counter members 119, such as nuts, to which the rotation-freezing members 117 may be tied. Since a plurality of support grooves 120 are formed each correspondingly on the inner surfaces of the stationary and movable side board 114 and 115, plate materials 121 of a length equaling the predetermined interval between the opposed side boards 114 and 115 can be vertically superposed as individually suspended on the support grooves 120 which are laterally opposed at horizontal positions.

In the above example, since the plate materials 121 cannot smoothly be inserted into and extracted from the frame when the interval between the opposed support grooves 120 happens to equal the length of the plate materials 121 while the interval of the opposite side boards 114 and 115 is being adjusted to the width of accommodation of the plate materials 121, the housing frame must allow for a slight clearance for the interval under discussion. The fine adjustment that is required in allowing this clearance is unexpectedly so difficult as to impose the problem of unduly consuming time.

The present inventor, with the object of solving the problematic point mentioned above, has proposed a frame for housing plate materials, which is provided on the mutually opposed inner surfaces of the laterally opposed side boards equally with a plurality of support grooves and provided therein as well with a means for adjusting the interval between the laterally opposed side boards and which is further provided on at least either of the mutually opposed inner surfaces of a pair of members suitably selected from among the side boards, bases (top and bottom plates) disposed on and under the side boards and joints interconnecting the side boards and the bases with adjusting projections adapted to protrude slightly from the support grooves (JP-A 2002-084081). Since the invention thus proposed contemplates allowing an interval endowed with a predetermined clearance to intervene between the opposed support grooves by simply causing the plate materials intended for accommodation in the frame to contact the adjusting projections and consequently adjusting the width of plate materials, it enables any person at all to effect adjustment of the clearance accurately and quickly.

This frame nevertheless is at a disadvantage in compelling a worker engaging in making the adjustment of clearance to take hold of a given plate material in one of his hands for the sake of advancing one end of the plate material into collision against one of the opposed inner surfaces furnished with the adjusting projections, then use the other hand in moving one of the side boards toward the other side board, and continue to keep hold of the plate material in the one hand till the work of adjustment is completed. Thus, the worker is obliged to carry out the work of keeping hold of the plate material in one hand and the work of moving the movable side board with the other hand at the same time. This operation is irksome unexpectedly, particularly so when the plate material has a large size. The desirability of enabling this operation to be efficiently performed, therefore, has been finding enthusiastic approval.

This invention has been assigned a task of solving the problem encountered by the conventional frame for housing plate materials as described above and has consequently pursued the object of providing a frame for housing plate materials, which enables the work of adjusting clearance in setting the width for accommodation of plate materials to be carried out more easily.

SUMMARY OF THE INVENTION

With a view to accomplishing this object, the invention provides a frame for housing plate materials, comprising: a pair of laterally opposed side boards having formed equally thereon a plurality of parallel, mutually opposed support grooves; bases (top and bottom plates) formed on and beneath the side boards; joints for interconnecting the side boards and the bases; means provided in the frame to adjust an interval between the side boards in order that given plate materials may be accommodated in the frame as spaced at predetermined intervals by causing paired edges of the plate materials to be inserted into the opposed support grooves; adjusting projections protruding slightly from the support grooves and disposed on at least either of mutually opposed inner surfaces of members suitably selected from among the side boards, bases and joints; and auxiliary adjusters disposed near the adjusting projections and adapted to allow terminal parts on at least one side of the plate materials to collide against the mutually opposed inner surfaces by simply moving one of the side boards toward the other side board while keeping the plate materials at predetermined or suitably selected positions between the opposed side boards.

The auxiliary adjusters are preferably provided with slopes for guiding the terminal parts of the plate materials to the at least either of mutually opposed inner surfaces containing the adjusting projections thereon.

The auxiliary adjusters are preferably provided with clips capable of nipping the paired edges of the plate materials.

The auxiliary adjusters are preferably provided with supporting stands or supporting wires capable of maintaining a height of the plate materials at a level equal to a height the adjusting projections.

The auxiliary adjusters are preferably provided with suction cups capable of inducing fast adhesion thereto of the plate materials.

The auxiliary adjusters are preferably provided with magnets capable of nipping the plate materials.

The auxiliary adjusters are preferably provided with hooks capable of supporting the terminal parts of the plate materials.

Preferably, the auxiliary adjusters are detachably attached to the joints.

The adjusting projections are preferably disposed on either of the side boards destined to be moved toward the other side board, and the plate materials are placed on guide rails laid on the bases or on the inner surfaces of the bases so as to ready the plate materials for adjustment of clearance.

The adjusting projections are preferred to have a height thereof increased in order that the plate materials may be supported between the support grooves and the adjusting projections and subjected as such to adjustment of clearance.

This invention, owing to the disposition of the auxiliary adjusters at the predetermined positions between the two side boards, enables the opposite terminal parts of plate materials to collide individually against the adjusting projections by simply placing the plate materials intended for accommodation between the side boards and moving one of the side boards toward the other side board. Then, by fixing the movable side board at the position finally reached, it is made possible to set the interval between the support grooves corresponding to the side boards at a magnitude incorporating a predetermined clearance.

The above and other objects and the other characteristics of this invention will become apparent from the detailed description to be given below based on the accompanying drawings.

BRIEF EXPLANATION OF THE DRAWINGS

FIG. 4 is a front view of essential part illustrating a means for setting the width of accommodation in the frame for housing plate materials shown in FIG. 1, with the means posed in a state prior to setting of the width.

FIG. 5 is a front view of essential part illustrating the accommodation width-setting means of FIG. 4, with the means posed in a state engaging in the setting of the width.

FIG. 6 is a front view of essential part illustrating the accommodation width-setting means of FIG. 4, with the means posed in a state having completed the setting of the width.

FIG. 7 is a front view of essential part illustrating a means for setting the width of accommodation in a frame for housing plate materials according to the second embodiment of this invention, with the means posed in a state prior to setting of the width.

FIG. 10 is a front view of essential part illustrating a means for setting the width of accommodation in a frame for housing plate materials according to the third embodiment of this invention, with the means posed in a state prior to setting the width.

FIG. 11 is a front view of essential part illustrating the accommodation width-setting means of FIG. 10, with the means posed in a state in process of setting the width.

FIG. 16 is a front view of essential part illustrating the accommodation width-setting means of FIG. 15, with the means posed in a state in process of setting the width.

FIG. 17 is a partial cross section illustrating the appearance of a frame for housing plate materials according to the sixth embodiment of this invention, which is produced when a stationary side board is viewed from the inside.

FIG. 18 is a cross section taken through FIG. 17 along line XVII—XVII.

FIG. 19 is a front view of essential part illustrating a means for setting the width of accommodation in a frame for housing plate materials according to the seventh embodiment of this invention, with the means posed in a state engaging in setting the width.

FIG. 22 is a front view of essential part illustrating the accommodation width-setting means of FIG. 21, with the means posed in a state having completed the setting of the width.

FIG. 23 is a front view of essential part illustrating a means for setting the width of accommodation in a frame for housing plate materials according to the ninth embodiment of this invention, with the means posed in a state prior to setting of the width.

FIG. 26 is a front view of essential part illustrating a means for setting the width of accommodation in a frame for housing plate materials according to the tenth embodiment of this invention, with the means posed in a state prior to setting of the width.

FIG. 27 is a front view of essential part illustrating the accommodation width-setting means of FIG. 26, with the means posed in a state in process of setting the width.

FIG. 30 is a front view of essential part illustrating the accommodation width-setting means of FIG. 29, with the means posed in a state in process of setting the width.

FIG. 31 is a front view of essential part illustrating the accommodation width-setting means of FIG. 29, with the means posed in a state having completed the setting of the width.

FIG. 32 is a front view of essential part illustrating a modification of the accommodation width-setting means of FIG. 29, with the modified means posed in a state prior to the setting of the width.

FIG. 33 is a front view of essential part illustrating a means for setting the width of accommodation in a frame for housing plate materials according to the 12$^{th}$ embodiment of this invention, with the means posed in a state prior to setting of the width.

FIG. 34 is a front view of essential part illustrating the accommodation width-setting means of FIG. 33, with the means posed in a state in process of setting the width.

FIG. 35 is a front view of essential part illustrating the accommodation width-setting means of FIG. 33, with the means posed in a state having completed the setting of the width.

FIG. 36 is a front view of essential part illustrating a means for setting the width of accommodation in a frame for housing plate materials according to the 13$^{th}$ embodiment of this invention, with the means posed in a state prior to attachment of an auxiliary adjuster.

FIG. 37 is a front view of essential part illustrating the accommodation width-setting means of FIG. 36, with the means posed in a state prior to setting of the width.

FIG. 38 is a front view of essential part illustrating the accommodation width-setting means of FIG. 36, with the means posed in a state in process of setting the width.

FIG. 39 is a front view of essential part illustrating the accommodation width-setting means of FIG. 36, with the means posed in a state having completed the setting of the width.

FIG. 42 is a front view of essential part illustrating the accommodation width-setting means of FIG. 40, with the means posed in a state in process of the setting of the width.

FIG. 43 is a front view of essential part illustrating the accommodation width-setting means of FIG. 40, with the means posed in a state having completed the setting of the width.

FIG. 46 is a front view of essential part illustrating the accommodation width-setting means of FIG. 44, with the means posed in a state in process of the setting of the width.

FIG. 47 is a front view of essential part illustrating the accommodation width-setting means of FIG. 44, with the means posed in a state having completed the setting of the width.

DESCRIPTION OF THE PREFERRED EMBODIMENT

Figure 1:
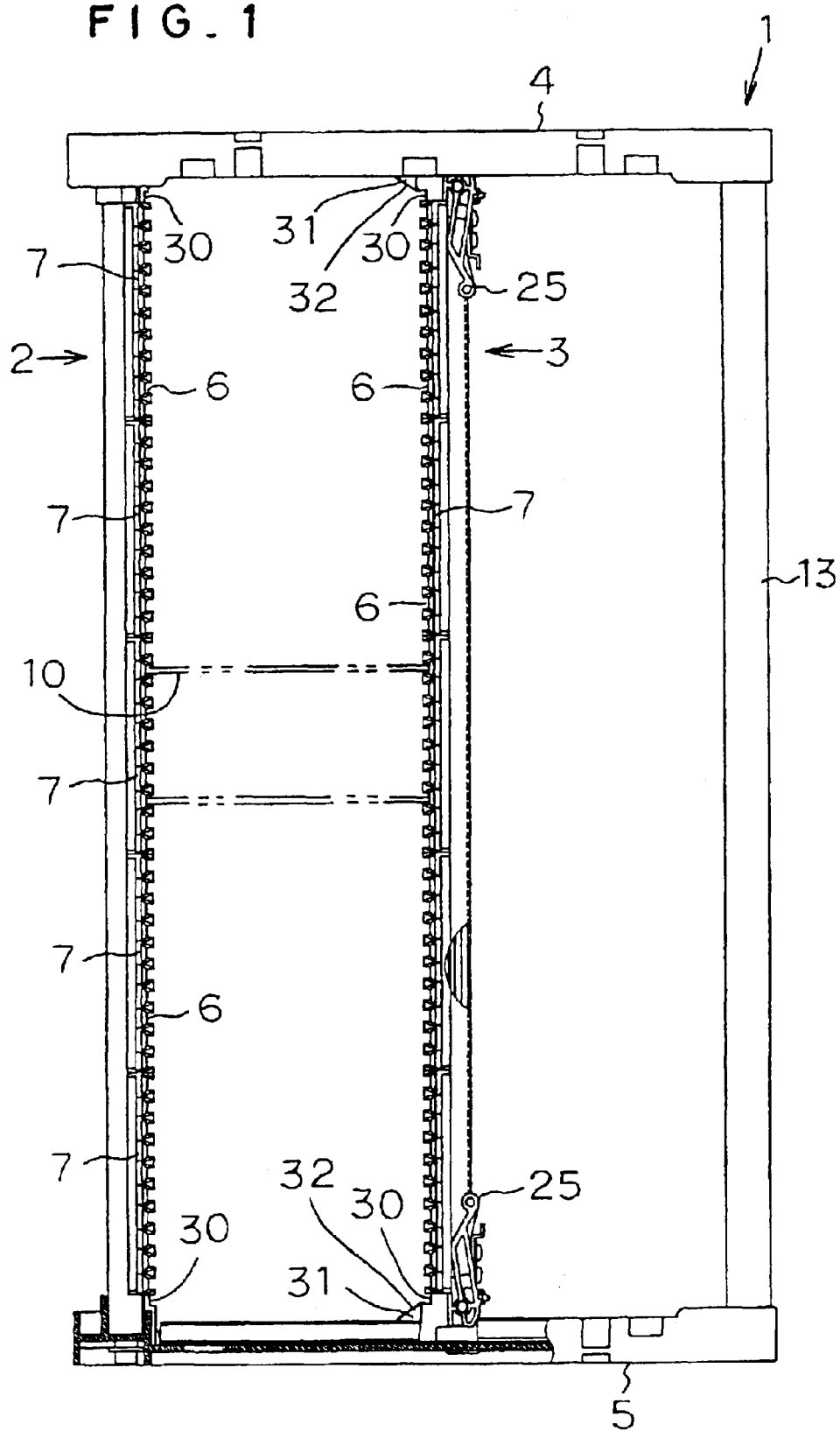
FIG. 1 is a front view illustrating a frame for housing plate materials according to the first embodiment of this invention.
Figure 2:
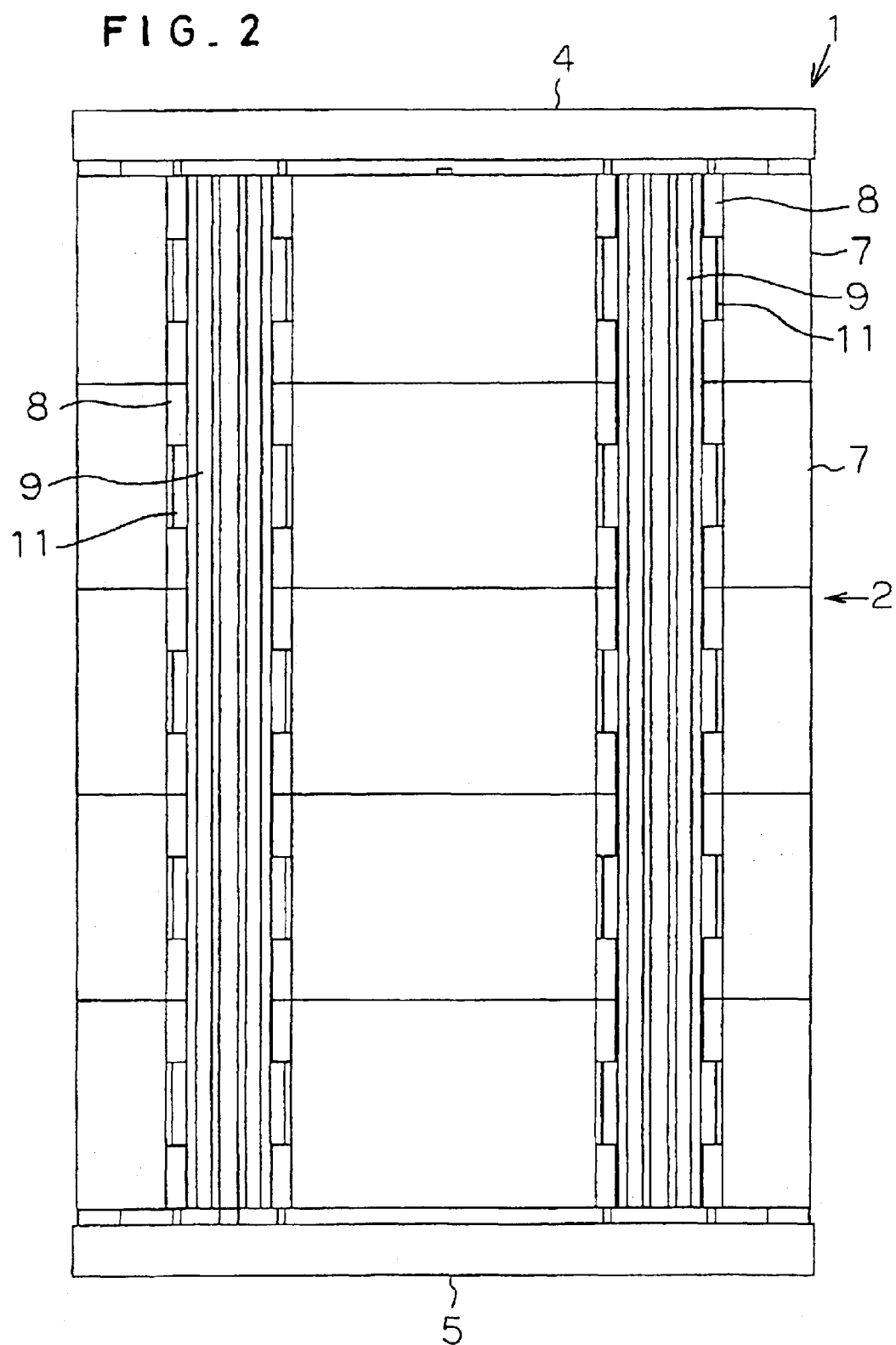
FIG. 2 is a left side view of the frame for housing plate materials shown in FIG. 1.
Figure 3:
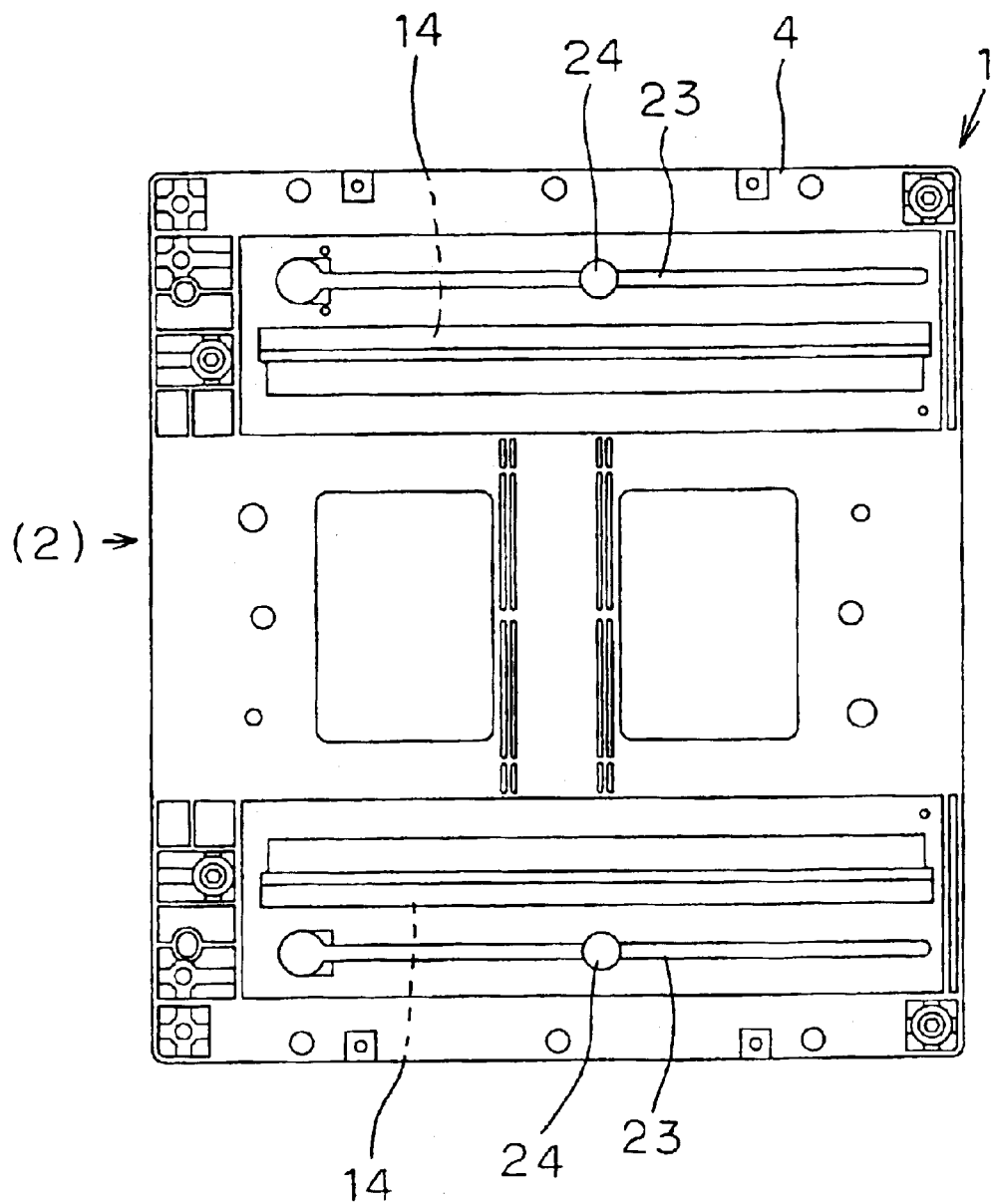
FIG. 3 is a plan view of the frame for housing plate materials shown in FIG. 1.

Now, the frame for housing plate materials contemplated by this invention will be described below with reference to the accompanying drawings.

FIGS. 1 to 6 illustrate a frame 1 for housing plate materials according to the first embodiment of this invention. Owing to the formation of a multiplicity of regularly spaced parallel support grooves 6, the provision of a pair of side boards 2 and 3 having the support grooves 6 disposed so as to be mutually opposed on the inner surfaces of the frame 1, the provision of a pair of bases 4 and 5 (a top plate 4 and a bottom plate 5) supporting the side boards 2 and 3 as opposed across a predetermined interval, and further the incorporation of a means to adjust the interval between the laterally opposite side boards 2 and 3, the plate material-housing frame 1 enables the paired edges of plate materials 10 to be inserted into the opposed support grooves 6 and accommodated as regularly spaced in the frame. In addition, owing to the disposition of adjusting projections 30 slightly protruding from the support grooves 6 on at least either of the mutually opposed inner surfaces of members suitably selected from among (a) the side boards 2 and 3, (b) the bases 4 and 5 (the top plate 4 and the bottom plate 5) formed on and beneath the side boards 2 and 3 and (c) joints 12 and 15 interconnecting the side boards 2 and 3 and the bases 4 and 5, the plate material-housing frame 1 facilitates the adjustment of clearance of the plate materials 10 intended for accommodation. Furthermore, owing to the disposition near the adjusting projections of auxiliary adjusters 31 adapted to attain the introduction of the terminal parts on at least one side of the plate materials to the opposed inner surfaces retaining the adjusting projections by simply placing plate materials at stated positions between the side boards and moving one of the side boards toward the other side board, the plate material-housing frame 1 further facilitates the adjustment of clearance. The component parts of the plate material-housing frame 1 will be described in detail below.

The plate material-housing frame 1 illustrated in FIG. 1 to FIG. 6 relies on the combination of racks and pinions to effect parallel translation of one of the side boards toward the other side board. The mechanism to be used for this parallel translation does not need to be exclusively limited to the combination so illustrated but may be selected from heretofore known devices, such as those using belts and chains. It does not need to be exclusively the type combining long holes and studs that is illustrated in the example of the conventional plate material-housing frame cited above. In short, it is only required to be capable of moving one of the side boards to the other side board and consequently adjusting the interval between the two side boards to the width of accommodation of plate materials.

FIGS. 1 to 6 illustrate the bases 4 and 5 (the top plate 4 and the bottom plate 5) which are formed of a synthetic resin, such as a plastic substance. The material for the bases 4 and 5 does not need to be exclusively limited to the synthetic resin. The bases 4 and 5 may be formed of the so-called sheet metal that is obtained by bending a galvanized steel sheet with a press so as to impart proper stiffness thereto. The stationary and movable side board 2 and 3 which are disposed between the pair of bases 4 and 5 have numerous support grooves 6 formed on their respective inner surfaces and have a plurality of unit boards 7 each provided thereon with a pair of mutually opposed and vertically paralleled hooked pieces formed contiguously on the respective outer surfaces on slightly inner sides than the opposite terminal parts in the direction of length. That is, the stationary and movable side boards 2 and 3 have a predetermined number of unit boards 7 disposed vertically on one and same plane and assume an integrated structure by inserting tongue pieces 11 of hat materials 9 into the pair of hooked pieces 8 on the outer surfaces and transfixing the plurality of unit boards 7 with the tong pieces 11. The stationary side board 2 is fixed at either of the laterally opposite terminal parts thereof to the base 4 and the base 5 with connecting materials, such as angle materials (not shown), attached to the upper and lower terminals of the hat materials 9 at the pair of opposite terminals. Paired support pillars 13 are erected at the corner parts of the other opposite terminals of the plate material-housing frame 1 so as to support and fix the terminal parts of the bases 4 and 5 with a predetermined interval. In other words, the bases 4 and 5, the hat materials 9 of the stationary side board 2, the connecting materials, such as angle materials (not shown), and the support pillars 13 cooperate to form a stiff box as a housing frame.

The joints (sliders) 15 are fastened to the upper and lower terminals of the pair of hat materials 9 of the movable side board 3. The joints 15 are each provided therein with pinions (not shown) that are rotatably disposed in order that the relevant wheel centers may perpendicularly intersect each other. The mutually interlocking pinions (not shown) are rotatably disposed at least one each at the four corner parts of the movable side board 3, and guide rails 14 having incised therein such racks (not shown) as are meshed with all the pinions are disposed on the inner surfaces of the bases 4 and 5 in the directions perpendicular to the stationary side board 2 for the purpose of enabling the movable side board 3 to produce a parallel translation of itself toward or away from the stationary side board 2 as held opposite the stationary side board 2. The bases 4 and 5 are perforated to form therein long holes 23 parallel to the relevant guide rails 14, provided with fixing means 24 adapted to pass through the long holes 23 and nip the relevant bases from the front and rear sides, and as well furnished on the inner sides of these bases with operating parts 25 for the fixing means in order that the movable side board 3 which has completed the parallel translation may be immobilized at the position so reached.

Now, the procedure for setting the width of accommodation of plate materials 10 will be explained with reference to FIGS. 4 to 6 which illustrate the lower essential part of the plate material-housing frame 1. As illustrated in FIG. 6, the adjusting projections 30 (the parts protruding inward from the support grooves 6) are disposed on the mutually opposed inner surfaces of the joints 12 and 15 which are opposed to each other so as to satisfy the relation, D>E, wherein D denotes the interval to be set between the opposed support grooves 6 of the side boards 2 and 3 and E the interval between the adjusting projections. Since the interval D between the support grooves 6 is allowed, by causing the plate materials 10 to contact the adjusting projections 30 and consequently adjusting the plate materials 10 to the interval E, to acquire a magnitude slightly larger than the interval E, the sheet materials 10 can be smoothly inserted into and extracted from the interval D with proper clearance. Preferably, the is adjusting projections 30 are so disposed that the interval D may be about 1 mm larger than the interval E. Though the adjusting projections 30 have been described as being disposed at the positions at which the two joints 12 and 15 are opposed to each other. Optionally, they may be disposed on the inner surface of either of the joints on the condition that the projections should be increased to twice the original height. The means to set the width of accommodation by dint of the adjusting projections 30 so disposed herein is shared as a common recourse by all the embodiments to be cited herein below.

The auxiliary adjusters 31 are adjoined as by adhesion to the support grooves 6 which are fitted at least on one side with the adjusting projections 30. The auxiliary adjusters 31 have a cross section of the shape of a triangular block containing a perpendicular surface (mounting surface) 34 and a slope 32 directed diagonally downward from the upper end of the perpendicular surface 34. These auxiliary adjusters 31 are so disposed that the slope 32 directed diagonally downward from the lower surface of the support grooves 6 fitted with the adjusting projections 30 may reach a level below the upper surfaces of the guide rails 14 disposed on the base (bottom plate 5). The plate material-housing frame 1 of the first embodiment is provided on the movable side board 3 side with the auxiliary adjusters 31. Thus, when the terminals on one side of the plate materials 10 are placed as illustrated in FIG. 4 on the support grooves fitted on the stationary side board 2 side with the adjusting projections and, at the same time, the other terminals of the plate materials 10 are set on the guide rails 14 and released from the operator's hold, and the movable side board 3 is moved toward the stationary side board 2 as illustrated in FIG. 5, then the other terminals of the plate materials 10 will eventually reach the slope 32, ascend along the slope 32, and finally reach the adjusting projections 30 on the movable side board 3 side as illustrated in FIG. 6 to complete the adjustment of clearance. The auxiliary adjusters 31 do not need to be formed exclusively by adhesion but may be integrally formed as with joints by injection molding.

In the first embodiment, the auxiliary adjusters 31 are disposed contiguously on the movable side board 3 side. They may be disposed on the stationary side board 2 side as in the second embodiment cited herein below.

Figure 8:
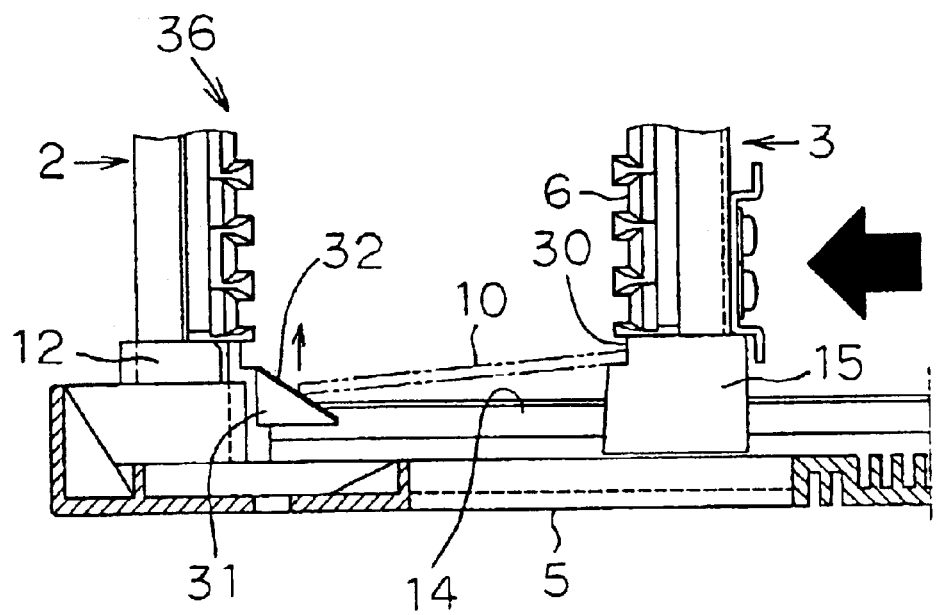
FIG. 8 is a front view of essential part illustrating the accommodation width-setting means of FIG. 7, with the means posed in a state in process of setting the width.
Figure 9:
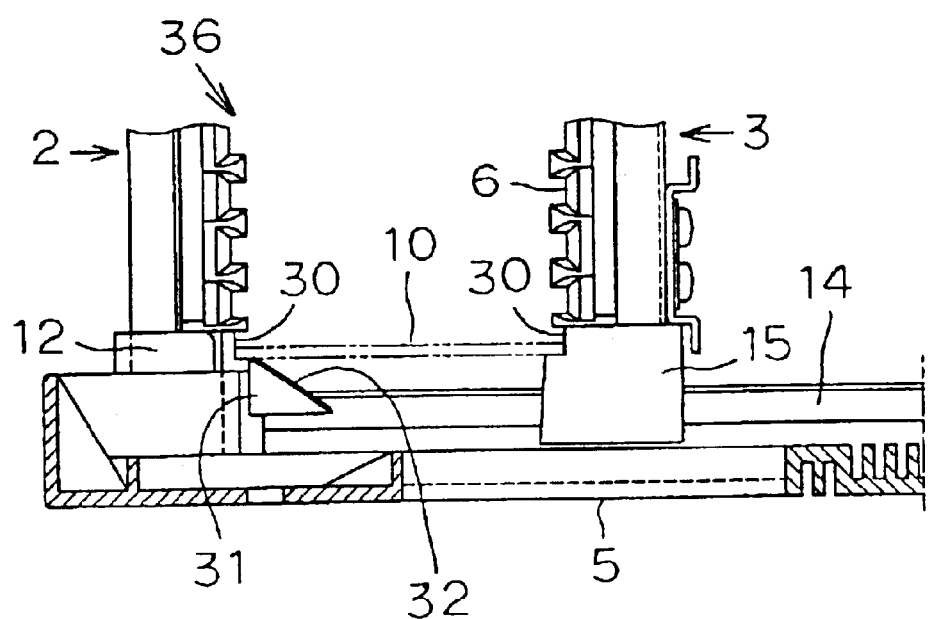
FIG. 9 is a front view of essential part illustrating the accommodation width-setting means of FIG. 7, with the means posed in a state having completed the setting of the width.

FIG. 7 to FIG. 9 are side views of essential part (only lower essential part) illustrating a plate material-housing frame 36 according to the second embodiment of this invention with the object of aiding explanation of a means to set the width of accommodation of plate materials 10; FIG. 7 depicting the state prior to the setting, FIG. 8 the state in process of setting, and FIG. 9 the state having completed the setting. Since the plate material-housing frame 36 of the second embodiment illustrated in FIG. 7 to FIG. 9 is identical in construction (bases 4 and 5, stationary and movable side board 2 and 3, etc.) with the plate material-housing frame 1 of the first embodiment with the sole exception of having the auxiliary adjusters 31 disposed on the movable side board 5, the explanation thereof will be omitted.

The plate material-housing frame 36 of the second embodiment differs from that of the first embodiment only with respect that the auxiliary adjusters 31 perfectly identical in construction with that of the first embodiment is disposed contiguously on the stationary side board 2 side while the countertype of the first embodiment is disposed contiguously on the movable side board 3 side. When the terminals on one side of the plate materials 10 are placed on the support grooves of the movable side board 3 fitted with the adjusting projections, then the other terminals of the plate materials 10 are allowed to land on the guide rails 14 by releasing the plate members 10 from the operator's hold, and then the movable side board 3 is moved toward the stationary side board 2, the other terminals of the plate materials 10 will eventually reach the slope 32, ascend along the slope 32 as illustrated in FIG. 8, and finally reach the adjusting projections 30 on the stationary side board 2 side as illustrated in FIG. 9 to complete the adjustment of clearance.

FIG. 10 and FIG. 11 are front views of essential part (only lower essential part) illustrating a plate material-housing frame 41 according to the third embodiment of this invention with the object of aiding explanation of a means to set the width of accommodation of plate materials 10; FIG. 10 depicting the state prior to the setting of the width and FIG. 11 the state in process of setting the width. The plate material-housing frame 41 has auxiliary adjusters 31 individually disposed on both the stationary side board 2 and the movable side board 3. Since the plate material-housing frame 41 in other respect is identical in construction with the plate material-housing frame 1 of the first embodiment, the explanation thereof will be omitted. This plate material-housing frame 41 is such that when the plate materials 10 are laid on the upper (horizontal) surfaces of the guide rails as illustrated in FIG. 10 and the movable side board 3 is moved toward the stationary side board 2 as illustrated in FIG. 11, there is no necessity for setting the plate materials 10 in advance in the support grooves 6 fitted with the adjusting projections 30 because the opposite terminals of the plate materials 10 are automatically led along the two slopes 32 to the two adjusting projections 30. Owing to the alleviation of the necessity, the frame of this embodiment allows the work of adjusting the clearance more easily than the first and second embodiments.

Figure 48:
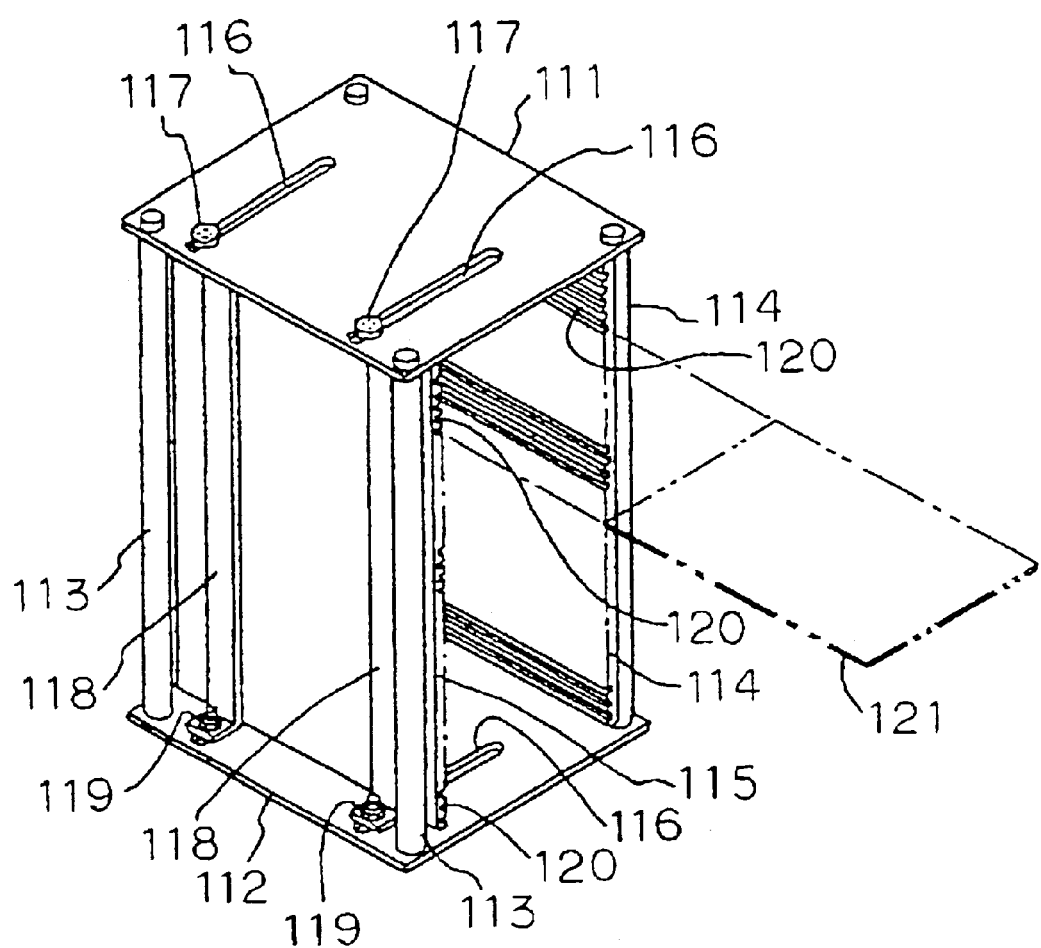
FIG. 48 is a perspective view illustrating an example of the conventional frame for housing plate materials.

This invention can be applied not only to the plate material-housing frame of the type of the embodiments cited above that relies on the combination of racks and pinions to effect parallel translation of the one side board to the other side board, but also to the plate material-housing frame of the conventional type that resorts to the combination of long holes and studs illustrated in FIG. 48. It can be further applied to the plate material-housing frame of the type that relies on the use of chains to effect parallel translation of the one side board to the other side board. Of these types, the type of the plate material-housing frame which resorts to the combination of long holes and studs will be explained below with reference to FIGS. 12 to 14.

Figure 12:
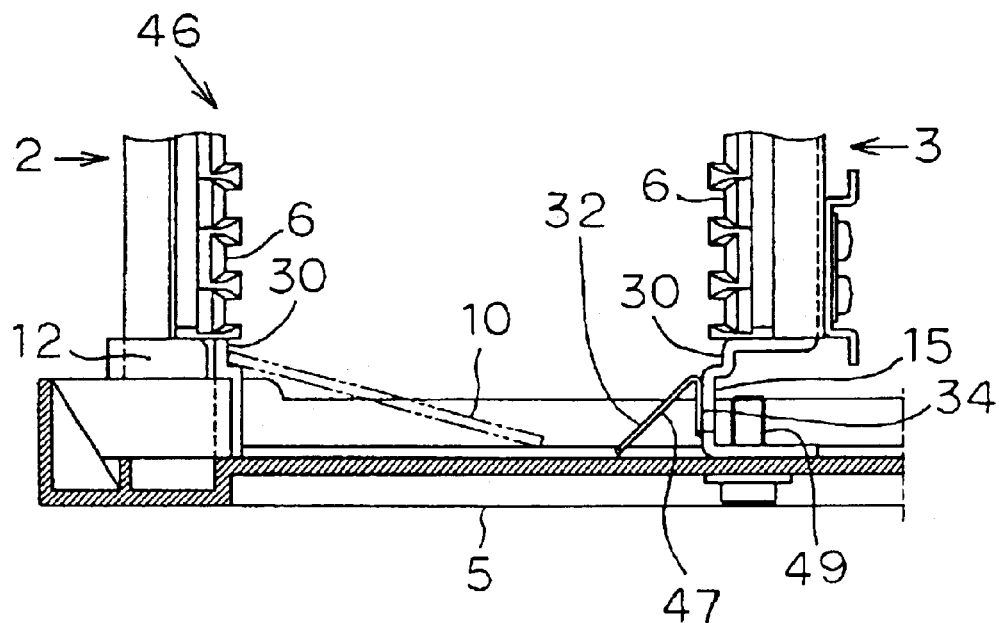
FIG. 12 is a front view of essential part illustrating a means for setting the width of accommodation in a frame for housing plate materials according to the fourth embodiment of this invention, with the means posed in a state prior to setting the width.
Figure 13:
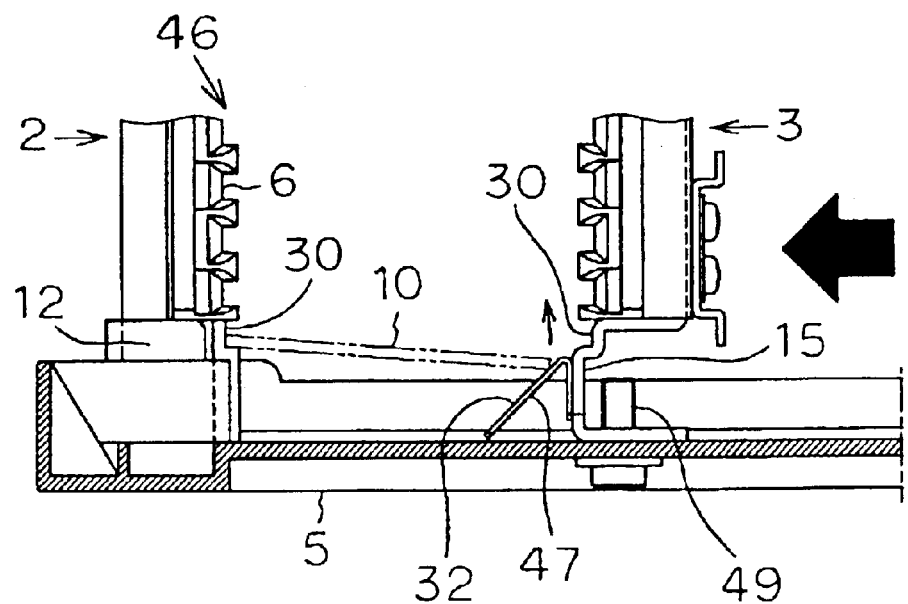
FIG. 13 is a front view of essential part illustrating the accommodation width-setting means of FIG. 12, with the means posed in a state m process of setting the width.
Figure 14:
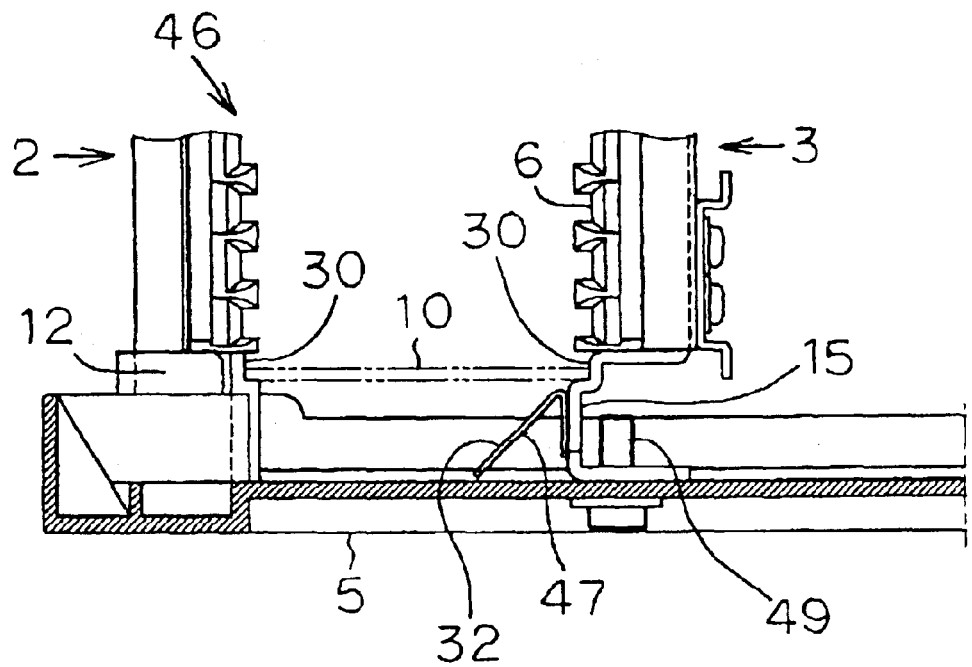
FIG. 14 is a front view of essential part illustrating the accommodation width-setting means of FIG. 12, with the means posed in a state having completed the setting of the width.

FIGS. 12 to 14 are front views of essential part (only the lower essential part) illustrating a plate material-housing frame 46 according to the fourth embodiment of this invention with the object of aiding explanation of a means to set the width of accommodation of plate materials 10; FIG. 12 depicting the state prior to the setting, FIG. 13 the state in process of the setting, and FIG. 14 the state having completed the setting. This plate material-housing frame 46 differs from the plate material-housing frames of the first to third embodiments which resort to the combination of racks and pinions in respect that it is provided with a means to adjust the interval between the laterally opposite side boards 2 and 3 by dint of the combination of long holes (not shown) and studs 49. Since the fourth embodiment is nearly identical in construction in other respect with the first embodiment, the explanation thereof will be omitted. Auxiliary adjusters 47 in the sheet material-housing frame 46 of the fourth embodiment are different from the auxiliary adjusters 31 of the first to third embodiments in respect that they have a shape resulting from folding a flat plate in an acute angle while their countertypes have the shape of a block, but are identical therewith in containing a perpendicular (mounting) surface 34 and a slope 32. By having the slope 32 so disposed as to contact the bottom and top plates 5 and 4, they manifest the same effect as the auxiliary adjusters 31 of the shape of a block according to the first to the third embodiment. To be specific, when the terminals on one side of the plate materials 10 are placed on the support grooves fitted with the adjusting projections 30 on the stationary side board 2 side similarly to the first embodiment as illustrated in FIG. 12, the terminals on the other side of the plate materials 10 are placed on the long holes (not shown) by releasing the plate materials 10 from the operator's hold, and the movable side board 3 is moved toward the stationary side board 2, the terminals on the other side of the plate materials 10 will eventually reach the slope 32 as illustrated in FIG. 13, ascend along the slope 32, and finally reach the adjusting projections 30 on the movable side board 3 side as illustrated in FIG. 14 to complete the adjustment of clearance similarly to the first embodiment. The plate material-housing frame 46 of the present embodiment, however, requires both the bottom plate 5 side and the top plate 4 side to be duly adjusted because the movable side board 3 thereof, unlike the equivalents in the plate material-housing frames 1, 36 and 41 of the first to third embodiments, is not adapted to produce a parallel translation.

In this case, the plate materials 10 are fated to fall during the adjustment of the top plate 4 side. For the purpose of preventing this drop, it is commendable to give the adjustment first to the bottom plate 5 side and then upend it to bring the top plate 4 side to the bottom before giving the adjustment to the top plate 4, to have the plate housing frame 46 fall sideways before giving the adjustment to both the bottom plate 5 side and the top place 4 side, or to utilize a supporting means, such as a rotary clip or a suction cup, which is capable of preventing the plate materials 10 from falling on the top plate 4 side as specifically described herein below.

This invention can be applied to not only the auxiliary adjusters 31 and 47 of the preceding embodiments that contain slopes 32, but also various types of auxiliary adjusters.

Figure 15:
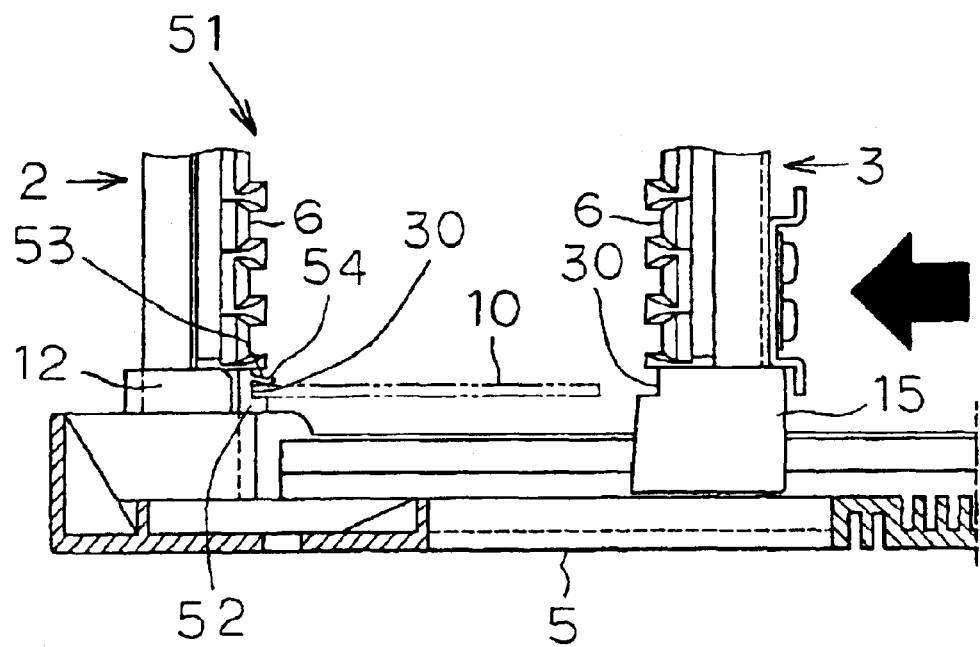
FIG. 15 is a front view of essential part illustrating a means for setting the width of accommodation in a frame for housing plate materials according to the fifth embodiment of this invention, with the means posed in a state prior to setting the width.

FIG. 15 and FIG. 16 are front views of essential part (only the lower essential part) illustrating a plate material-housing frame 51 of the fifth embodiment with the object of aiding explanation of a means to set the width of accommodation of plate materials 10; FIG. 15 depicting the state in process of setting the width and FIG. 16 the state having completed the setting. The plate material-housing frame 51 of the fifth embodiment is provided with auxiliary adjusters 52 furnished in the support grooves with clips 53 in the place of the auxiliary adjusters 31 of the first embodiment. Since it is identical in construction with the countertype of the first embodiment except for the auxiliary adjusters 52, its explanation will be omitted. The clips 53 of the auxiliary adjusters 52 are provided on at least one side thereof with nipping pieces 54, which are capable of nipping the edges of plate materials 10 (between the nipping pieces 54 and the support grooves in the illustration of FIG. 15) and keeping the upper sides of the plate materials 10 flush with the surfaces of the relevant support grooves fitted with the adjusting projections 30.

The plate material-housing frame 51 of the fifth embodiment is so constructed that when the edges on one side of the plate materials 10 are nipped with the auxiliary adjusters 52 containing the clips 53 disposed in the support grooves fitted with the adjusting projections 30 on the stationary side board 2 side as illustrated in FIG. 15 and then released from the operator's hold, and the movable side board 3 is moved toward the stationary side board 2, the edges on the other side of the plate materials 20 will eventually reach the adjusting projections 30 on the movable side board 3 side as illustrated in FIG. 16 to complete the adjustment of clearance.

Though the auxiliary adjusters 52 fitted with the clips 53 are integrally formed with the joints 12 in the present embodiment, they may be attached to the joints 12 and 15 or the side boards 2 and 3 by adhesion. While the clips 53 are fixed integrally to the joints herein, they may be adapted to move (rotate) instead.

FIG. 17 is a cross section (showing only the lower part) illustrating the appearance of a plate material-housing frame 56 of the sixth embodiment that is produced when the stationary side board 2 is viewed from the inner side, and FIG. 18 is a cross section taken through FIG. 17 along line XVII—XVII. As illustrated in FIGS. 17 and 18, the plate material-housing frame 56 of the sixth embodiment is provided with auxiliary adjusters 57 which are fitted with movable clips 58 unlike the auxiliary adjusters 52 of the fifth embodiment which are fitted with stationary clips 53. The auxiliary adjusters 57 are provided with rotary shafts 59 disposed on the stationary side board 2 as illustrated in FIG. 18 and clips 58 formed at the leading terminals of arms 60 extended from the rotary shafts 59 with a pair of nipping pieces 54 similarly to the fifth embodiment. They are used for the purpose of making the terminals on one side of the plate materials 10 collide against the adjusting projections 30 on the stationary side board 2 side and lodge themselves in the support grooves and then enabling the laterally opposite side faces of the colliding terminals of the plate materials to be rotated around the rotary shafts 59 as fulcrums by 270 degrees in the direction of the arrow mark and then nipped from the opening part side. They are used as rotated, when necessary, for the adjustment of clearance, and are returned to the home positions by being rotated in the reverse direction after the adjustment of clearance is completed. Since their construction in other respects and their method of use after the clips 58 have been rotated and then made to nip the laterally opposite surfaces of the terminals of the plate materials 10 are the same as those of the plate material-housing frame of the fifth embodiment, the descriptions thereof will be omitted.

The plate material housing frames 51 and 56 respectively of the fifth and sixth embodiments, when provided only with the clip type auxiliary adjusters 52 and 57, have the possibility of warping when the plate materials 10 are long in the direction of width. In this case, the bases 4 and 5 may be supplemented with supporting stands 63 which are capable of preventing the plate materials 10 from warping as specifically described herein below. It is commendable to give the supporting stands 63 a height such that the terminal parts of the plate materials 10 may conform to the height of support grooves that are fitted with the adjusting projections 30.

The auxiliary adjusters may be simply provided with such supporting stands 63 as are disposed to support the plate materials 10 in conformity with the height of the adjusting projections 30. Examples of such auxiliary adjusters will be explained below.

Figure 20:
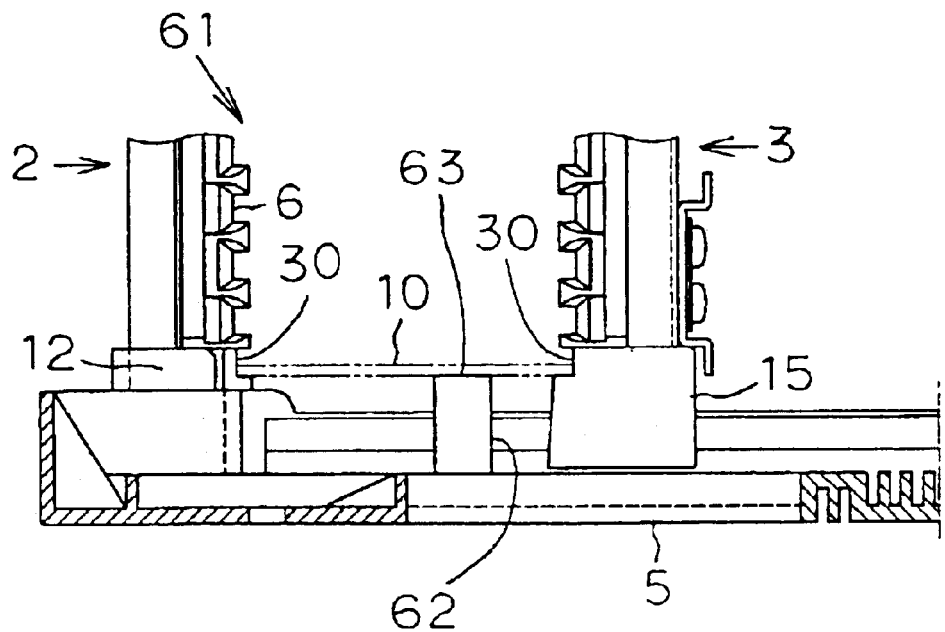
FIG. 20 is a front view of essential part illustrating the accommodation width-setting means of FIG. 19, with the means posed in a state having completed the setting of the width.

FIGS. 19 and 20 are front views of essential part (showing only the lower essential part) of a plate material-housing frame 61 of the seventh embodiment with the object of aiding explanation of a means for setting the width of accommodation of the plate materials 10; FIG. 19 depicting the state in process of the setting and FIG. 20 the state having completed the setting. Auxiliary adjusters 62 of this plate material-housing frame 61 are provided with the supporting stands 63 that are thrust out to the height at which the plate materials 10 are supported in conformity with the height of the adjusting projections 3 and they are attached to the top plate 4 or the bottom plate 5 by adhesion. Since the plate material-housing frame 61 is identical in construction with the countertype of the first embodiment with the exception of the auxiliary adjusters 62, the explanation thereof will be omitted. The plate material-housing frame 61 of this seventh embodiment is such that when the plate materials 10 are mounted and supported on the supporting stands 63 in such a manner that the terminal on one side of the plate materials 10 may collide against the support grooves containing the adjusting projections 30 of the stationary side board 2 side and then released from the operator's hold, and the movable side board 3 is moved toward the stationary side board 2 as illustrated in FIG. 19, since the plate materials 10 are made to maintain their height by the supporting stands 63, the terminals on the other side of the plate materials will eventually reach the adjusting projections 30 on the movable side board 3 side as illustrated in FIG. 20 to complete the adjustment of clearance. Incidentally, when the plate material-supporting surfaces of the supporting stands 63 can be allotted such a large area as is sufficient for enabling the plate materials 10 to slide on the supporting stands 63 without changing their height, the plate materials 10 are no longer required to be set in the support grooves fitted with the adjusting projections 30. In this case, since the movement of the movable side board 3 toward the stationary side board 2 results in causing the terminals of the plate materials 10 to be pushed by the adjusting projections 30 on the movable side board 3 side to the adjusting projections 30 on the stationary side board 2 side, the work of adjusting clearance can be rendered easy in accordance as the necessity of setting the plate materials 10 in the support grooves fitted with the adjusting projections 30 is obviated.

Though the auxiliary adjusters 62 of the plate material-housing frame 61 of the seventh embodiment are fixed to the top plate 4 and the bottom plate 5, they may be designed in the rotary type as in the eighth embodiment to be described next.

Figure 21:
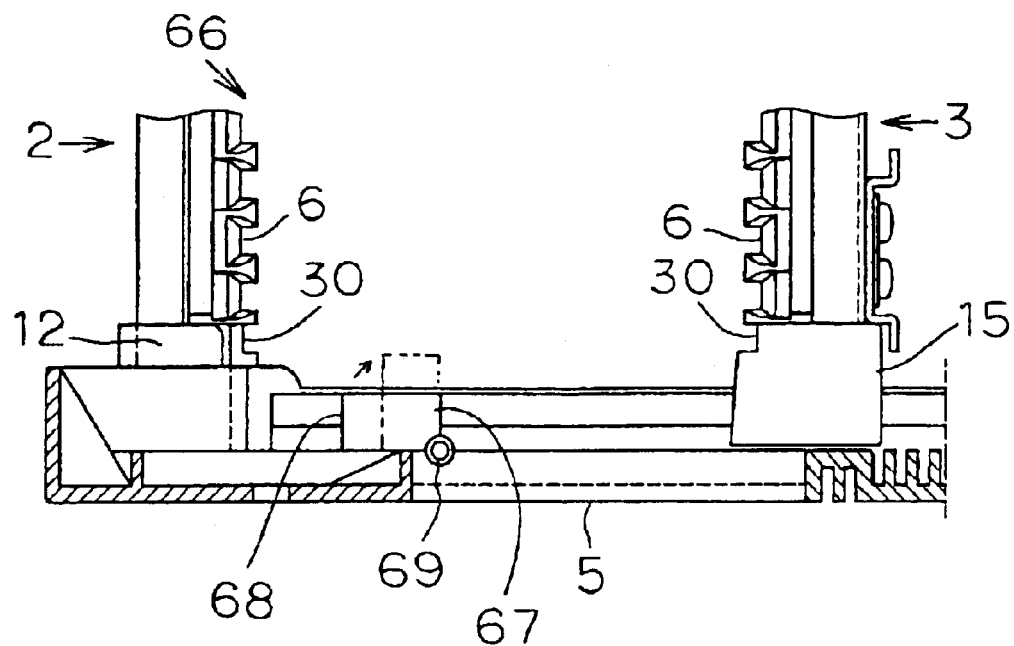
FIG. 21 is a front view of essential part illustrating a means for setting the width of accommodation in a frame for housing plate materials according to the eighth embodiment of this invention, with the means posed in a state prior to setting of the width.

FIGS. 21 and 22 are front views of essential part (showing only the lower essential part) illustrating a plate material-housing frame 66 of the eighth embodiment with the object of aiding explanation of a means to set the width of accommodation of the plate materials 10; FIG. 21 depicting the state prior to the setting and FIG. 22 the state in process of the setting. The auxiliary adjusters 67 of this plate material-housing frame 66 are fixed, as illustrated in FIGS. 21 and 22, to the top plate 4 and the bottom plate 5 as with hinges while having supporting stands 68 disposed rotatably around rotating shafts 69 as fulcrums and they are used, only when the adjustment of clearance is to be effected, as thrust out by the rotation of the supporting stands 68 till the height of the plate material 20 equals the height of the adjusting projections 30 as illustrated in FIG. 21. Since the plate material-housing frame 66 of the present embodiment is identical in construction excepting the auxiliary adjusters 67 and in mode of use owing to the thrust thereof by the rotation of the supporting stands 68 to the height equaling the height of the support grooves fitted with the adjusting projections 30 with the countertype of the seventh embodiment, their explanation will be omitted.

In the place of the auxiliary adjusters which are provided with such supporting stands 63 and 68 as are contemplated by the seventh and eighth embodiments, those which are provided with such supporting wires as are contemplated by the ninth embodiment described below may be used.

Figure 24:
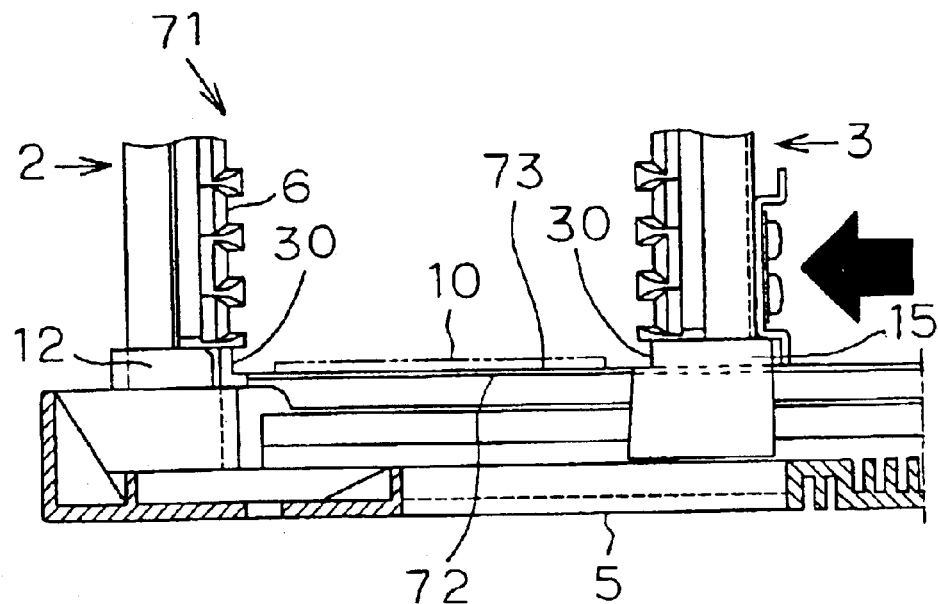
FIG. 24 is a front view of essential part illustrating the accommodation width-setting means of FIG. 23, with the means posed in a state in process of setting the width.
Figure 25:
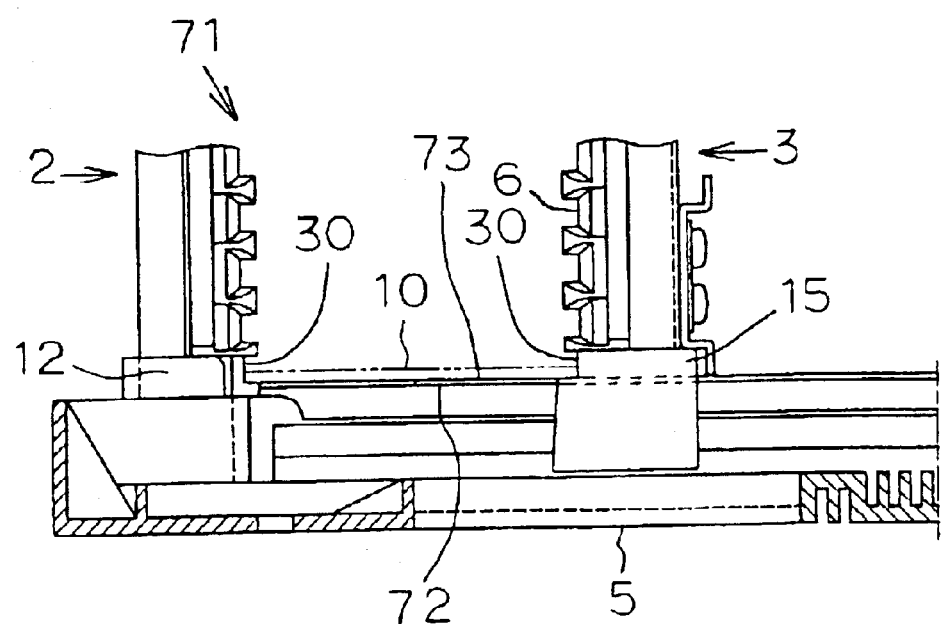
FIG. 25 is a front view of essential part illustrating the accommodation width-setting means of FIG. 23, with the means posed in a state having completed the setting of the width.

FIGS. 23 to 25 are front views of essential part (showing only the lower essential part) illustrating a plate material-housing frame 71 of the ninth embodiment with the object of aiding explanation of a means for setting the width of accommodation of the plate materials 10; FIG. 23 depicting the state prior to the setting, FIG. 24 the state in process of the setting and FIG. 25 the state having completed the setting. The plate material-housing frame 71 of this ninth embodiment is provided with auxiliary adjusters 72 which have at least two stiff supporting wires laid parallel beneath the support grooves containing the adjusting projections 30 on the stationary side board 2 side, passed through the lower parts of the support grooves containing the adjusting projections 30 of the movable side board 3 and thrust out. Since this plate material-housing frame 71 of the present embodiment is identical in construction excepting these auxiliary adjusters 72 with the countertype of the first embodiment, the explanation thereof will be omitted. The plate material-housing frame 71 of this ninth embodiment is such that when the plate materials 10 are laid to be supported on the supporting wires 73 as illustrated in FIG. 23 similarly to the supporting stands 63 of the seventh embodiment and then released from the operator's hold, and the movable side board 3 is moved toward the stationary side board 2 as illustrated in FIG. 24, since the plate materials 10 are enabled by the supporting wires 73 to maintain their height equal to the height of the adjusting projections 30, the terminals on the other side of the plate materials 10 will eventually reach the adjusting projections 30 on the movable side board 3 side and, owing to the push given by the adjusting projections 30 on the movable side board 3 side, the remaining terminals on the plate materials 10 reach the adjusting projections 30 on the stationary side board 2 side as illustrated in FIG. 25 to complete the adjustment of clearance. In this ninth embodiment, therefore, the work of adjustment is rendered easy in proportion as the necessity for setting the plate materials 10 to the support grooves containing the adjusting projections 30 is obviated.

In the place of the stiff supporting wires used in the present embodiment, shafts made of metal or resin or other implements similar thereto (such as screws) may be used. When the plate materials 10 to be handled happen to be incapable of bending, the wires may be made of expansible rubber. When the wires of such an expansible material are used, they will not thrust out of the movable side board 3 unlike the wires of a stiff material.

Figure 28:
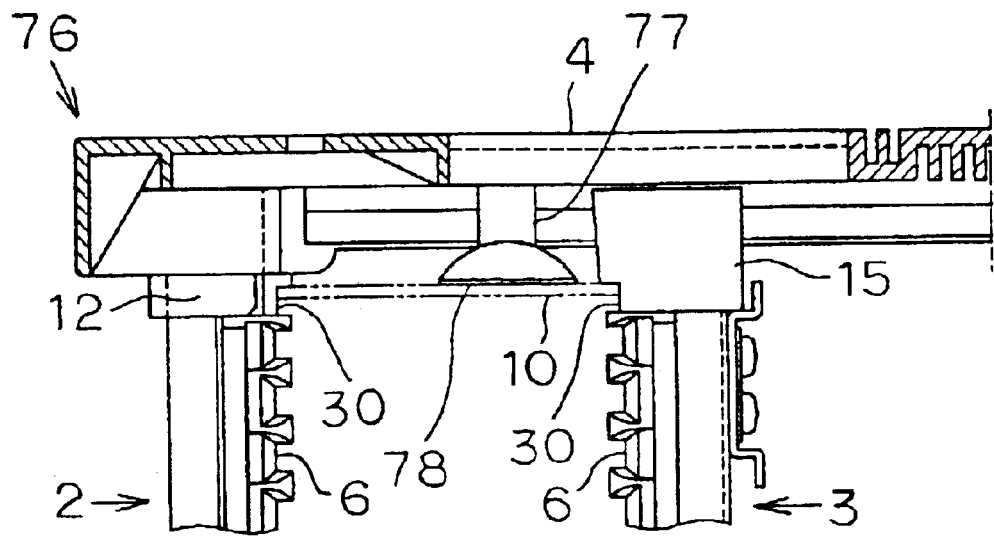
FIG. 28 is a front view of essential part illustrating the accommodation width-setting means of FIG. 26, with the means posed in a state having completed the setting of the width.

The auxiliary adjusters may be of such a type as is furnished with suction cups capable of taking firm hold of plate materials by suction. FIGS. 26 to 28 are front views of essential part (showing only the upper essential part) of a plate material-housing frame 76 of the tenth embodiment with the object of aiding explanation of a means to set the width of accommodation of plate materials 10; FIG. 26 depicting the state prior to the setting, FIG. 27 the state in process of the setting and FIG. 28 the state having completed the setting. The plate material-housing frame 76 of this tenth embodiment has auxiliary adjusters 77 that are furnished with suction cups 78 adapted to attract plate materials 10 at the leading terminals and are attached to the bases (the top plate 4 and the bottom plate 5) by adhesion or suction. Since the plate material-housing frame 76 of this embodiment is identical in construction excepting the auxiliary adjusters 77 with the countertype of the first embodiment, the explanation thereof will be omitted. The plate material-housing frame 76 of this tenth embodiment is such that when the terminals on one side of the plate materials 10 are advanced so as to collide against the support grooves containing the adjusting projections 30 on the stationary side board 2 side and the plate materials 10 are consequently allowed to adhere fast to the suction cups 78 as illustrated in FIG. 26 and then the plate materials 10 are released from the operator's hold, and the movable side board 3 is moved toward the stationary side board 2 as illustrated in FIG. 27, since the plate materials 10 are enabled by the suction cups 78 to maintain a height equal to the height of the support grooves containing the adjusting projections 30, the terminals on the other side of the plate materials 10 will eventually reach the adjusting projections 30 on the movable side board 3 to complete the adjustment of clearance as illustrated in FIG. 28. The auxiliary adjusters 77 which are provided with these suction cups, unlike those that are provided with the slopes 32 or those that are provided with the supporting stands 63, will not fall even during the adjustment of clearance on the top plate 4 side.

Figure 29:
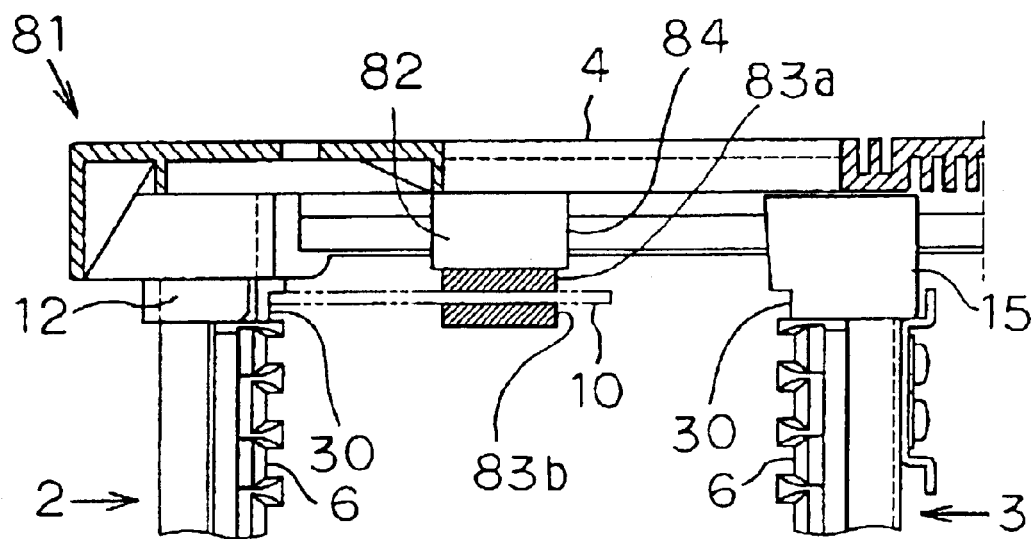
FIG. 29 is a front view of essential part illustrating a means for setting the width of accommodation in a frame for housing plate materials according to the 11$^{th}$ embodiment of this invention, with the means posed in a state prior to setting of the width.

The auxiliary adjusters may be of such a type as is enabled to nip the plate materials with magnets. FIGS. 29 to 31 are front views of essential part (showing only the upper essential part) of a plate material-housing frame 81 of the 11$^{th}$ embodiment with the object of aiding explanation of a means to set the width of accommodation of plate materials 10; FIG. 29 depicting the state prior to the setting, FIG. 30 the state in process of the setting and FIG. 31 the state having completed the setting. The plate material-housing frame 81 of this 11$^{th}$ embodiment is provided with auxiliary adjusters 82 containing magnets 83. The bases (the top plate 4 and the bottom plate 5) are provided with main bodies 84 each furnished at the leading terminals thereof with magnets 83a, and the main bodies 84 are provided with magnets 83b connected switchably thereto with hinges (not shown). Since the plate material-housing frame 81 of this 11$^{th}$ embodiment is identical in construction with the exception of the auxiliary adjusters 81 with the countertype of the first embodiment, the explanation thereof will be omitted.

The plate material-housing frame 81 of this 11$^{th}$ embodiment is such that when the plate materials 10 are nipped between the magnets 83a and 83b of the main bodies 84 in such a manner as allows the terminals on one side of the plate materials 10 to collide against the support grooves containing the adjusting projections 30 on the stationary side board 2 side, the plate materials 10 are released from the operator's hold, and the movable side board 3 is moved toward the stationary side board 2, since the plate materials 10 nipped by the magnets 83a and 83b are enabled to maintain a height equal to the height of the adjusting projections 30, the terminals on the other side of the plate materials 10 will eventually reach the adjusting projections on the movable side board 3 side to complete the adjustment of clearance. FIG. 32 illustrates a modification of the 11$^{th}$ embodiment. When the bases (the top plate 4 and the bottom plate 5) happen to be made of a metallic material, the attachment and detachment of the auxiliary interval adjusters 82 having a lower retaining portion for the plate materials 10 relative to the base 4 can be rendered easy by additionally disposing magnets 83c at the positions of attachment of the main bodies 84 of the auxiliary interval adjusters 82.

The auxiliary adjusters mentioned above may be of such a type as is fitted with hooks adapted to support the terminal parts of plate materials 10. FIG. 33 to FIG. 35 are front views of essential part (showing only the upper essential part) illustrating a plate material-housing frame 86 of the 12th embodiment with the object of aiding explanation of a means to set the width of accommodation of plate materials 10; FIG. 33 depicting the state prior to the setting, FIG. 34 the state in process of the setting and FIG. 35 the state in which the setting has been completed. The plate material-housing frame 86 of this 12th embodiment is provided with expansible rubbery members 88 that are destined to be attached to the top plate 4 or the bottom plate 5, and with auxiliary adjusters 87 that are fitted at the leading terminals of rubbery members with hooks 89. The rubbery members 88 for use in the plate material-housing frame 86 of this embodiment have been selected on the condition that they possess such tensile force as is capable of balancing the force tending to induce a fall of the terminal parts on one side of the plate materials 10 having the terminal parts on the other side supported on the support grooves containing the adjusting projections 30, namely enabling the height of the plate materials 10 to remain in conformity with the height of the support grooves containing the adjusting projections 30. Since the plate material-housing frame 86 of this embodiment is otherwise identical in construction with the countertype of the first embodiment, the explanation thereof will be omitted.

The plate material-housing frame 86 of this 12th embodiment is such that when the terminals on one side of the plate materials 10 are made to collide against the support grooves containing the adjusting projections 30 on the stationary side board 2 side and, at the same time, the terminals on the other side of the plate materials are secured fast on the hooks 89 and the plate materials 30 are released from the operator's hold, and the movable side board 3 is moved toward the stationary side board 2 as illustrated in FIG. 34, since the plate materials 10 held fast by the hooks 89 are enabled to maintain their height, the terminals on the other side of the plate materials 10 will eventually reach the adjusting projections on the movable side board 3 side to complete the adjustment of clearance as illustrated in FIG. 35.

In the first to fourth embodiments, the auxiliary adjusters 31 and 47 furnished with the slopes 32 have been described as being preparatorily fixed to the joints 12 and 15 by adhesion or integral formation. Optionally, the auxiliary adjusters may be detachably fixed as will be described in the following embodiments.

FIG. 36 to FIG. 39 are front views of essential part (showing only the lower essential part) illustrating a plate material-housing frame 91 of the 13th embodiment with the object of aiding explanation of a means to set the width of accommodation of the plate materials 10; FIG. 36 depicting the state prior to the attachment of auxiliary adjusters 92, FIG. 37 the state having completed the attachment of the auxiliary adjusters 92 and prior to the initiation of the setting, FIG. 38 the state in process of the setting, and FIG. 39 the state having completed the setting. The plate material-housing frame 91 of this 13th embodiment has the auxiliary adjusters 92 incorporating therein the adjusting projections 30 disposed detachably therefrom as by screwing. Since it is identical in construction otherwise (the bases 4 and 5, the stationary and movable side boards 2 and 3, etc.), the description thereof will be omitted.

The plate material-housing frame 91 of this 13th embodiment, while it is in the state having the auxiliary adjusters not yet attached thereto as illustrated in FIG. 36, detachably attaches the auxiliary adjusters 92 provided with support grooves containing the adjusting projections 30 to the joints 15 by screwing as illustrated in FIG. 37. The auxiliary adjusters 92 are in the shape of a triangular block endowed with the slope 32 directed diagonally downward from the lower surfaces of the support grooves and are disposed, similarly to those of the first embodiment, so that the slopes reach a level lower than the upper surfaces of the guide rails 14. The plate material-housing frame 91 of this 13th embodiment has the auxiliary adjusters 92 detachably fixed to the joints 15 on the movable side board 3 side and has members 93 forming support grooves as well fixed detachably to the joints 12 on the stationary side board 2 side in conformity with the support grooves of the auxiliary adjusters 92. When the terminals on one side of the plate materials 10 are supported on the support grooves of the members 93 on the stationary side board 2 side as illustrated in FIG. 37 and the terminals on the other side of the plate materials 10 are placed on the guide rails 14 and then released from the operator's hold, and the movable side board 3 is moved toward the stationary side board 2 as illustrated in FIG. 38, the terminals on the other side of the plate materials 10 will eventually reach the slopes 32, ascend along the slopes 32 and finally reach the adjusting projections 30 on the movable side board 3 side as illustrated in FIG. 39 to complete the adjustment of clearance. By having the auxiliary adjusters detachably attached as in the case of the plate material-housing frame 91, it is made possible to have the auxiliary adjusters utilized again in a separate plate material-housing frame and to decrease the quantity of auxiliary adjusters relative to the quantity of plate material-housing frames as well.

The embodiments cited above have been described as having the opposite terminals of the plate materials 10 supported on the support grooves as separated by a proper distance from the bases 4 and 5 in due consideration of the possibility that some component parts may be so carried as to thrust out from the rear surfaces of the plate materials 10. When the rear surfaces of the plate materials 10 are flat because of the absence of such a component part, the adjustment of clearance may be effected by having the plate materials 10 placed on the bases 4 and 5 or on the guide rails 14 laid on the inner surfaces of the bases 4 and 5 as contemplated by the subsequent 14th embodiment.

Figure 40:
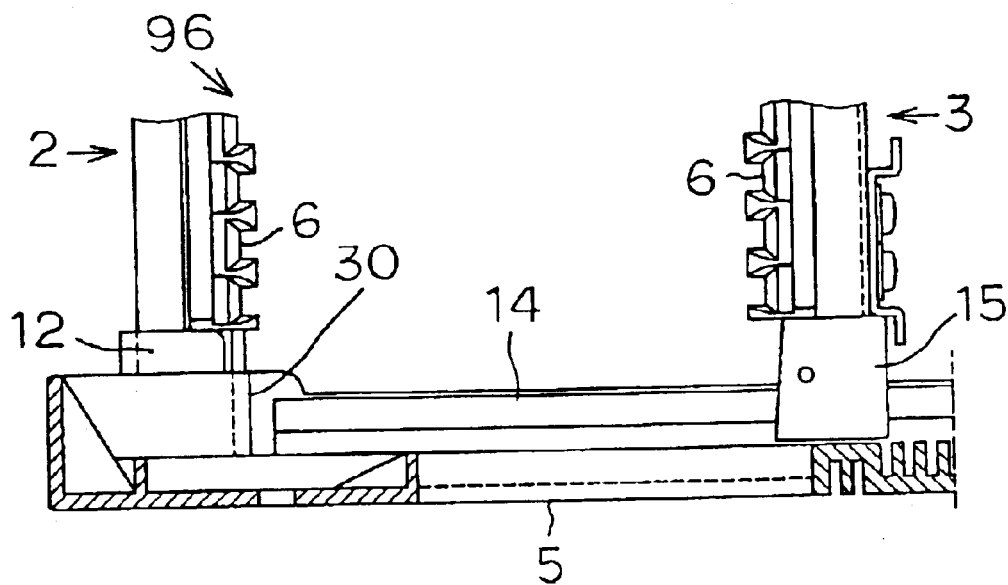
FIG. 40 is a front view of essential part illustrating a means for setting the width of accommodation in a frame for housing plate materials according to the 14$^{th}$ embodiment of this invention, with the means posed in a state prior to attachment of members provided with an adjusting projection.

FIGS. 40 to 43 are front views of essential part (showing only the lower essential part) illustrating a plate material-housing frame 96 of the 14th embodiment with the object of aiding explanation of a means to set the width of accommodation; FIG. 40 depicting the state prior to the attachment of members 98 furnished with the adjusting projections 30, FIG. 41 the state having attached the members 98 and prior to the setting, FIG. 42 the state in process of the setting and FIG. 43 the state having completed the setting. The plate material-housing frame 96 of this 14th embodiment has the members 98 containing the adjusting projections 30 detachably disposed as by screwing. Since it is identical in construction otherwise (the bases 4 and 5, the stationary and movable side boards 2 and 3, etc.) with the countertype of the first embodiment, the description thereof will be omitted.

Figure 41:
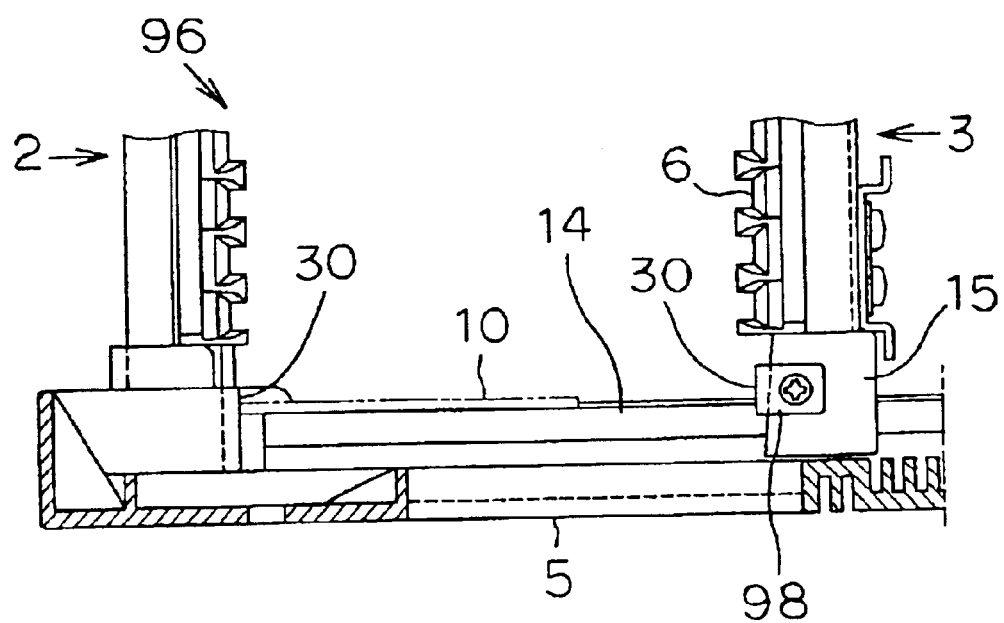
FIG. 41 is a front view of essential part illustrating the accommodation width-setting means of FIG. 40, with the means posed in a state prior to setting of the width.

The plate material-housing frame 96 of this 14th embodiment, while it is in the state having the members 98 containing the adjusting projections 30 not yet attached thereto as illustrated in FIG. 40, detachably attaches the members 98 furnished with the adjusting projections 30 to the joints 15 by screwing as illustrated in FIG. 41. When the members 98 are fixed at such positions as enable them to contact the end surfaces of the plate materials 10 placed on the bases 4 and 5, then the plate materials 10 are so placed on the guide rails 14 as to make the terminals on one side of the plate materials 10 contact the joints 12 and then released from the operator's hold, and the movable side board 3 is moved toward the stationary side board 2 as illustrated in FIG. 42, the terminals on the other side of the plate materials will eventually reach the adjusting projections 3 on the movable side board 3 as illustrated in FIG. 43 to complete the adjustment of clearance. That is to say, the guide rails 14 fulfill the role of auxiliary adjusters described in the preceding embodiments. Incidentally, in the plate material-housing frame of such a type as combines long holes with studs as illustrated in the fourth embodiment, the adjustment of the width may be attained by placing the members 98 directly on the inner surfaces of the bases 4 and 5 in the place of the guide rails 14 and attaching the members 98 to the joints 15 as aligned to the inner surfaces of the bases 4 and 5. In this case, the inner surfaces of the bases 4 and 5 fulfill the role of the auxiliary adjusters of the various embodiments mentioned above. In the foregoing explanations of the method of use, the plate materials 10 have been described as being placed on the guide rails 14 so that the end surfaces of the plate materials 10 may contact the joints 12. The end surfaces do not need to be exclusively placed so as to collide against the joints 12, but may be placed on the guide rails so as to be positioned between the two side boards 2 and 3. In this case, when the movable side board 3 is moved toward the stationary side board, the terminals of the plate materials 10 are pushed by the adjusting projections 30 on the movable side board 3 till they reach the adjusting projections 30 on the stationary side board 2 side. Thus, the work of adjustment is rendered easy in proportion as the necessity for setting the plate materials 10 so as to contact the adjusting projections 30 is obviated.

The preceding embodiments have been described as having the plate materials supported parallel on the mutually opposed inner surfaces during the course of the adjustment of clearance. The adjustment of clearance does not need to be exclusively limited to this mode, but may be implemented by having the plate materials 10 supported diagonally as described in the subsequent 15$^{th}$ embodiment.

Figure 44:
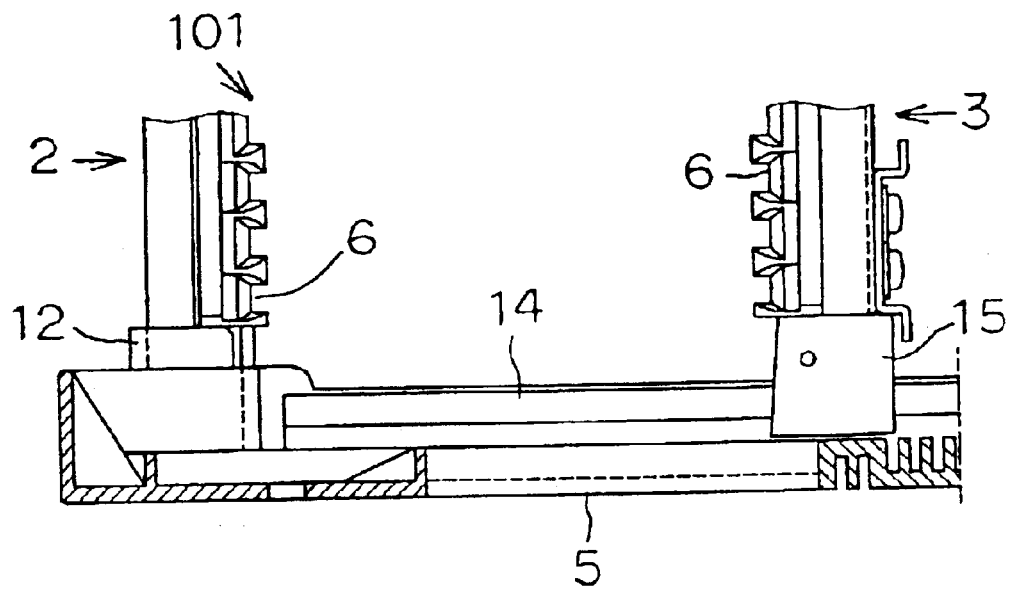
FIG. 44 is a front view of essential part illustrating a means for setting the width of accommodation in a frame for housing plate materials according to the 15$^{th}$ embodiment of this invention, with the means posed in a state prior to attachment of auxiliary adjusters.

FIGS. 44 to 47 are front views of essential part (showing only the lower essential part) illustrating a plate material-housing frame 101 of the 15$^{th}$ embodiment with the object of aiding explanation of a means to set the width of accommodation of plate materials 10; FIG. 44 depicting the state prior to the attachment of auxiliary adjusters 102, FIG. 45 the state having attached the auxiliary adjusters 102 and prior to the setting, FIG. 46 the state in process of the setting and FIG. 47 the state having completed the setting. The plate material-housing frame 101 of this 15$^{th}$ embodiment has the auxiliary adjusters 102 containing the adjusting projections 30 on either side of the side boards 2 and 3 detachably fixed as by screwing and supported as well diagonally between the supporting grooves 6 on the other side board side and the adjusting projections 30 of the auxiliary adjusters 102 so as to increase the height of the adjusting projections 30 enough to allow adjustment of clearance (increasing the distance between the supporting grooves 6 and the adjusting projections 30 used for the adjustment of clearance to a size slightly larger than the interval between the opposed supporting grooves 6). Since the plate material-housing frame 101 of this 15$^{th}$ embodiment is identical in construction otherwise (the bases 4 and 5, the stationary and movable side board 2 and 3, etc.) with the countertype of the first embodiment, the explanation thereof will be omitted.

Figure 45:
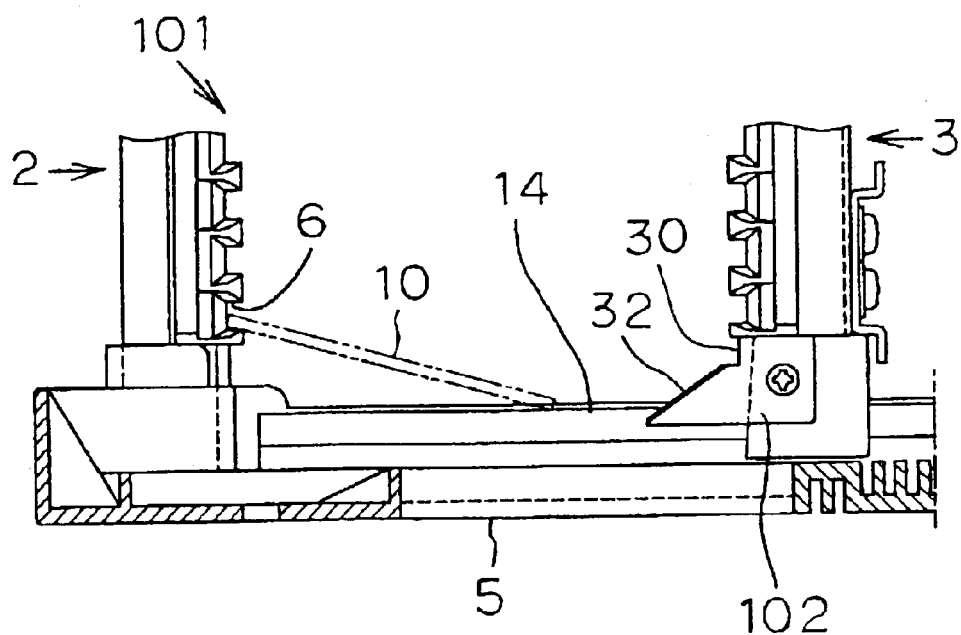
FIG. 45 is a front view of essential part illustrating the accommodation width-setting means of FIG. 44, with the means posed in a state prior to setting of the width.

The plate material-housing frame 101 of this 15$^{th}$ embodiment, while it is in the state having the auxiliary adjusters 102 not yet attached thereto as illustrated in FIG. 44, detachably attaches the auxiliary adjusters 102 provided with support grooves containing the adjusting projections 30 as illustrated in FIG. 45 and resembling the auxiliary adjusters 92 of the 13$^{th}$ embodiment as by screwing. The auxiliary adjusters 102 are in the shape of a triangular block containing slopes 32 directed diagonally downward from the lower surfaces of the support grooves and are provided, similarly to the first embodiment, with slopes 32 which reach a level lower than the upper surfaces of the guide rails 14. The plate material-housing frame 101 of this 15$^{th}$ embodiment is such that when the auxiliary adjusters 102 are detachably fixed on the movable side board 3 side and the terminals on one side of the plate materials 10 are supported on the support grooves 6 on the stationary side board 2 side as illustrated in FIG. 45, the terminals on the other side of the plate materials 10 are placed on the guide rails 14 and are released from the operator's hold, and the movable side board 3 is moved toward the stationary side boars 2 as illustrated in FIG. 46, then the terminals on the other side of the plate materials 10 will eventually reach the slopes 32 and ascend along the slopes 32 and finally reach the adjusting projections 30 on the movable side board 3 side as illustrated in FIG. 47 to complete the adjustment of clearance.

The preceding embodiments have been described as having the adjusting projections disposed at the joints 12 and 15 that interconnect the side boards 2 and 3 and the bases (the top place 4 and the bottom plate 5). The adjusting projections 30 do not need to be exclusively limited in position to the joints 12 and 15, but may be disposed on the side boards 2 and 3 or on the bases (the top plate 4 and the bottom plate 5) formed at the upper and the lower ends of the side boards 2 and 3. The adjusting projections 30, as described in the first embodiment, may be disposed on the inner surfaces of either of the mutually opposed joints 12 and 15, with the height of the projections increased to twice the original size, on the inner surfaces of the side boards 2 and 3, or on the inner surfaces of the bases (the top plate 4 and the bottom plate 5).

The plate material-housing frames 51 and 56 provided with the auxiliary adjusters 52 and 57 containing clips 53 respectively according to the preceding fifth and sixth embodiments, the plate material-housing frame 76 provided with the auxiliary adjusters 77 containing the suction cups according to the tenth embodiment, the plate material-housing frame 81 provided with the auxiliary adjusters 82 containing the magnets 83 according to the 11$^{th}$ embodiment, and the plate material-housing frame 86 provided with the auxiliary adjusters 87 containing the hooks 89 according to the 12$^{th}$ embodiment will not suffer the top plate 4 to fall down during the adjustment of clearance on the top plate 4 side unlike the plate material-housing frames which are provided with the slopes 32 or the supporting stands 63.

This invention contemplates providing at least either of the mutually opposed inner surfaces of the bases, side boards or joints with the adjusting projections slightly protruding from the support grooves and providing as well the auxiliary adjusters in the proximity of the adjusting projections at predetermined or properly selected positions between the side boards. Thus, this invention is capable of providing a plate material-housing frame which enables the adjustment of clearance to be performed easily because the auxiliary adjusters allow the work of keeping the plate materials for accommodation in contact with the adjusting projections and adjusting the clearance of the plate materials meanwhile to be carried out with the plate materials released from the operator's hold.

The auxiliary adjusters mentioned above are so constructed as to have the slopes capable of guiding the terminal parts of the plate materials toward the mutually opposed inner surfaces containing adjusting projections on at least either side. When the movable side board is moved toward the stationary side board, then the terminals of the plate materials will eventually reach the slopes, ascend along the slopes, and finally reach the mutually opposed inner surfaces containing adjusting projections on at least either of the side board sides to complete the adjustment of clearance.

The auxiliary adjusters mentioned above are so constructed as to have the clips capable of nipping the edge parts of the plate materials. The clips nip the edge parts of the plate materials and maintain the height of the plate materials at a level equal to the height of the adjusting projections. When the movable side board is moved toward the stationary side board, the terminals on the other side of the plate materials will eventually reach the mutually opposed inner surfaces containing adjusting projections on at least either of the side board sides to effect the adjustment of clearance.

The auxiliary adjusters mentioned above are so constructed as to have the supporting stands or supporting wires that are capable of maintaining the height of the plate materials at a level equal to the height of the adjusting projections. When the plate materials are mounted on the supporting stands or wires and the movable side board is moved toward the stationary side board, since the supporting stands or wires maintain the height of the plate materials at a level equal to the height of the adjusting projections, the opposite terminal parts of the plate materials will eventually reach the mutually opposed inner surfaces containing the adjusting projections on at least one of the side board sides to allow the adjustment of clearance.

The auxiliary adjusters mentioned above are so constructed as to have the suction cups capable of inducing fast adhesion thereto of the plate materials. When the terminals on one side of the plate materials are made to collide against the adjusting projections on either of the side board sides and adhere fast to the suction cups and then the movable side board is moved toward the stationary side board, since the suction cups maintain the height of the plate materials at a level equal to the height of the adjusting projections, the terminals on the other side of the plate materials will eventually reach the mutually opposed inner surfaces containing the adjusting projections at positions of at least either of the side board sides to permit the adjustment of clearance.

The auxiliary adjusters mentioned above are so constructed as to have the magnets capable of nipping the plate materials. When the plate materials are nipped by the magnets in such a manner that the terminals on one side of the plate materials may collide against the adjusting projections on either of the side board sides and then the movable side board is moved toward the stationary side board, since the magnets nip the plate materials and maintain the height of the plate materials at a level equal to the height of the adjusting projections, the terminals on the other side of the plate materials will eventually reach the mutually opposed inner surfaces containing the adjusting projections on at least either of the side board sides to permit the adjustment of clearance.

The auxiliary adjusters mentioned above are so constructed as to have the hooks that are capable of supporting the terminal parts of the plate materials. When the terminals on one side of the plate materials are made to collide against the adjusting projections on either of the side board sides and the terminal parts of the plate materials are secured and supported by the hooks, then the plate materials are released of the operator's hold, and the movable side board is moved toward the stationary side board, since the hooks support the plate materials and maintain the height thereof at e level equal to the height of the adjusting projections, the terminals on the other side of the plate materials will eventually reach the mutually opposed inner surfaces containing the adjusting projections on at least either of the side board sides to permit the adjustment of clearance.

The auxiliary adjusters mentioned above can be reclaimed when they are detachably disposed to a stationary member as with joints.

The adjusting projections are disposed on either of the side boards which is destined to be moved to the other side board and the plate materials are placed on the bases or on the guide rails laid on the inner surfaces of the bases so as to permit the adjustment of clearance. Thus, the terminals of the plate materials are pushed by the adjusting projections on the movable side board till they reach the adjusting projections on the other side board side. The work of making the adjustment, therefore, is rendered easy in proportion as the necessity for setting the plate materials so as to contact the adjusting projections is obviated.

Further, according to this invention, by supporting the plate materials between the support grooves and the adjusting projections and increasing the height of the adjusting projections so as to permit the adjustment of clearance, it is made possible to support the plate materials diagonally and give them necessary adjustment of clearance.

What is claimed is:

1. A frame for housing plate materials, comprising:
    a pair of laterally opposed side boards having formed equally thereon a plurality of parallel, mutually opposed support grooves;
    bases that are top and bottom plates formed on and beneath the side boards, respectively;
    joints for interconnecting the side boards and the bases;
    means provided in the frame for adjusting an interval between the side boards in order that given plate materials may be accommodated in the frame as spaced at predetermined intervals as a consequence of insertion of paired edges of the plate materials into the opposed support grooves;
    adjusting projections protruding slightly from the support grooves and disposed on at least either of mutually opposed inner surfaces of members suitably selected from among the side boards, bases and joints; and
    auxiliary adjusters disposed near the adjusting projections and adapted to allow terminal parts on at least one side of the plate materials to collide against the mutually opposed inner surfaces as a consequence of simple movement of one of the side boards toward the other side board, with the plate materials kept at predetermined or suitably selected positions between the opposed side boards.

2. The plate material-housing frame according to claim 1, wherein said auxiliary adjusters are provided with slopes adapted for guiding the terminal parts of the plate materials to the at least either of mutually opposed inner surfaces containing the adjusting projections thereon.

3. The plate material-housing frame according to claim 1, wherein said auxiliary adjusters are provided with clips capable of nipping the paired edges of the plate materials.

4. The plate material-housing frame according to claim 1, wherein said auxillaxy adjusters are provided with supporting stands or supporting wires capable of maintaining a height of the plate materials at a level equal to a height of the adjusting projections.

5. The plate material-housing frame according to claim 1, wherein said auxiliary adjusters are provided with suction cups capable of inducing fast adhesion thereto of the plate materials.

6. The plate material-housing frame according to claim 1, wherein said auxiliary adjusters are provided with magnets capable of nipping the plate materials.

7. The plate material-housing frame according to claim 1, wherein said auxiliary adjusters are provided with hooks capable of supporting the terminal parts of the plate materials.

8. The plate material-housing frame according to claim 1, wherein said auxiliary adjusters are detachably attached to the joints.

9. The plate material-housing frame according to claim 1, wherein said adjusting projections are disposed on either of the side boards destined to be moved toward the other side board, and wherein guide rails laid on said bases or on the inner surfaces of said bases are adapted to receive the plate materials so as to ready the plate materials for adjustment of clearance.

10. The plate material-housing frame according to claim 1, wherein said support grooves and said adjusting projections are adapted to support the plate materials therebetween so as to increase a height of the adjusting projections and permit adjustment of clearance.

* * * * *